(12) United States Patent
Kuwagata et al.

(10) Patent No.: US 7,750,727 B2
(45) Date of Patent: Jul. 6, 2010

(54) VOLTAGE GENERATING CIRCUIT

(75) Inventors: Masaaki Kuwagata, Yokohama (JP); Yasuhiko Honda, Hiratsuka (JP); Yoshihiko Kamata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/260,366

(22) Filed: Oct. 29, 2008

(65) Prior Publication Data
US 2009/0115500 A1 May 7, 2009

(30) Foreign Application Priority Data
Nov. 5, 2007 (JP) .............................. 2007-287610

(51) Int. Cl.
*G05F 1/10* (2006.01)
(52) U.S. Cl. .................. 327/538; 327/540; 327/543; 323/313
(58) Field of Classification Search .................. None
See application file for complete search history.

(56) References Cited

U.S. PATENT DOCUMENTS

| 5,610,503 | A | 3/1997 | Fogg et al. | |
|---|---|---|---|---|
| 6,278,316 | B1 | 8/2001 | Tanzawa et al. | |
| 6,531,912 | B2 | 3/2003 | Katou | |
| 6,667,652 | B2 * | 12/2003 | Hosoki | 327/538 |
| 7,049,881 | B2 | 5/2006 | Moon et al. | |
| 7,315,198 | B2 * | 1/2008 | Park et al. | 327/541 |
| 7,564,300 | B2 * | 7/2009 | Lee | 327/540 |
| 2007/0216473 | A1 * | 9/2007 | Yamazaki et al. | 327/540 |
| 2007/0229149 | A1 * | 10/2007 | Pan et al. | 327/543 |

FOREIGN PATENT DOCUMENTS

| JP | 2000-105998 | 4/2000 |
|---|---|---|
| JP | 2000-268575 | 9/2000 |

OTHER PUBLICATIONS

U.S. Appl. No. 12/564,359, filed Sep. 22, 2009, Sako, et al.

* cited by examiner

*Primary Examiner*—Tuan Lam
(74) *Attorney, Agent, or Firm*—Oblon, Spivak, McClelland, Maier & Neustadt, L.L.P.

(57) ABSTRACT

A voltage generating circuit for outputting a voltage from an output terminal, has a first voltage dividing circuit which is connected between the output terminal and ground; a switch circuit connected between the output terminal and the first voltage dividing circuit; a first voltage detecting circuit which outputs a first pumping signal corresponding to a comparison result; a second voltage dividing circuit which is connected between the output terminal and the ground; a second voltage detecting circuit which outputs a second pumping signal corresponding to a comparison result; a pump circuit that outputs a voltage boosted from a power supply voltage; and a boost circuit which has a capacitive element having one end connected to the voltage dividing resistor of the first voltage dividing circuit.

8 Claims, 19 Drawing Sheets

VOLTAGE GENERATING CIRCUIT

CROSS-REFERENCE TO RELATED APPLICATION

This application is based upon and claims the benefit of priority from the prior Japanese Patent Application No. 2007-287610, filed on Nov. 5, 2007, the entire contents of which are incorporated herein by reference.

BACKGROUND OF THE INVENTION

1. Field of the Invention

The present invention relates to a voltage generating circuit for outputting a boosted voltage.

2. Background Art

For example, when data is written in a memory cell or data in a memory cell is deleted in a semiconductor memory made up of an EEPROM, a voltage higher than a power supply voltage is necessary.

A semiconductor memory requiring such a high voltage includes a boosting circuit (pump circuit) which boosts a power supply voltage and generates a required high voltage.

Some voltage generating circuits of the prior art include, for example, a standby boosting circuit which operates according to an output voltage during standby and an active boosting circuit which operates according to an output voltage during an active state (For example, Japanese Patent Laid-Open No. 2000-105998 and Japanese Patent Laid-Open No. 2000-268575).

SUMMARY OF THE INVENTION

According to one aspect of the present invention, there is provided: a voltage generating circuit for outputting a voltage from an output terminal, comprising: a first voltage dividing circuit which is connected between the output terminal and ground, and outputs a first monitor voltage obtained by resistively dividing the voltage outputted from the output terminal; a switch circuit connected between the output terminal and the first voltage dividing circuit; a first voltage detecting circuit which compares the first monitor voltage and a reference voltage and outputs a first pumping signal corresponding to a comparison result; a second voltage dividing circuit which is connected between the output terminal and the ground, outputs a second monitor voltage obtained by resistively dividing the voltage outputted from the output terminal, and has a larger resistance than a resistance of the first voltage dividing circuit; a second voltage detecting circuit which compares the second monitor voltage and the reference voltage and outputs a second pumping signal corresponding to a comparison result; a pump circuit that outputs a voltage boosted from a power supply voltage, to the output terminal in response to the first pumping signal or the second pumping signal; and a boost circuit which has a capacitive element having one end connected to the voltage dividing resistor of the first voltage dividing circuit and boosts a voltage of an other end of the capacitive element at a time when the switch circuit is switched from an off state to an on state.

According to the other aspect of the present invention, there is provided: a voltage generating circuit for outputting a voltage from an output terminal, comprising: a first voltage dividing circuit which is connected between the output terminal and ground, and outputs a first monitor voltage obtained by resistively dividing the voltage outputted from the output terminal; a switch circuit connected between the output terminal and the first voltage dividing circuit; a first voltage detecting circuit which compares the first monitor voltage and a reference voltage and outputs a first pumping signal corresponding to a comparison result; a second voltage dividing circuit which is connected between the output terminal and the ground, outputs a second monitor voltage obtained by resistively dividing the voltage outputted from the output terminal, and has a larger resistance than a resistance of the first voltage dividing circuit; a second voltage detecting circuit which compares the second monitor voltage and the reference voltage and outputs a second pumping signal corresponding to a comparison result; a pump circuit that outputs a voltage boosted from a power supply voltage, to the output terminal in response to the first pumping signal or the second pumping signal; and a reset circuit which is connected to an other end of the first voltage dividing circuit, applies one of a first voltage higher than the reference voltage and a second voltage lower than the reference voltage to the other end of the first voltage dividing circuit while the switch circuit is turned off, and applies the second voltage to the other end of the first voltage dividing circuit while the switch circuit is turned on, wherein the voltage applied to the other end of the first voltage dividing circuit while the switch circuit is turned off is switched to one of the first voltage and the second voltage at a time when the switch circuit is switched from the on state to the off state.

According to still further aspect of the present invention, there is provided: a voltage generating circuit for outputting a voltage from an output terminal, comprising: a first voltage dividing circuit which is connected between the output terminal and ground, and outputs a first monitor voltage obtained by resistively dividing the voltage outputted from the output terminal; a first switch circuit connected between the output terminal and the first voltage dividing circuit; a first voltage detecting circuit which compares the first monitor voltage and a reference voltage and outputs a first pumping signal corresponding to a comparison result; a second voltage dividing circuit which is connected between the output terminal and the ground, outputs a second monitor voltage obtained by resistively dividing the voltage outputted from the output terminal, and has a larger resistance than a resistance of the first voltage dividing circuit; a second voltage detecting circuit which compares the second monitor voltage and the reference voltage and outputs a second pumping signal corresponding to a comparison result; a pump circuit that outputs a voltage boosted from a power supply voltage, to the output terminal in response to the first pumping signal or the second pumping signal; a second switch circuit which is connected between an output of the first voltage dividing circuit and an input of the first voltage detecting circuit fed with the first monitor voltage, and is turned off while the first switch circuit is turned off; and a voltage keeping circuit that keeps the voltage inputted to the input at least until the second switch circuit is turned on after the first switch circuit is turned on.

According to still further aspect of the present invention, there is provided: a voltage generating circuit for outputting a voltage from an output terminal, comprising: a first voltage dividing circuit which is connected between the output terminal and ground, has a first voltage dividing resistor and a second voltage dividing resistor connected in series with the first voltage dividing resistor between two points, and outputs a first monitor voltage obtained by resistively dividing the voltage outputted from the output terminal; a first switch circuit connected between the output terminal and the first voltage dividing circuit; a first voltage detecting circuit which compares the first monitor voltage and a reference voltage and outputs a first pumping signal corresponding to a comparison result; a second voltage dividing circuit which is connected between the output terminal and the ground, outputs a second monitor voltage obtained by resistively dividing the voltage outputted from the output terminal, and has a larger resistance than a resistance of the first voltage dividing circuit; a second voltage detecting circuit which compares the second monitor voltage and the reference voltage and outputs a second pumping signal corresponding to a comparison result; a pump circuit that outputs a voltage boosted from a power supply voltage, to the output terminal in response to the first pumping signal or the second pumping signal; a second switch circuit which is connected between the first voltage dividing circuit and the ground; a third switch circuit which is connected between the first voltage dividing resistor and the second voltage dividing resistor and is turned on when the first switch circuit and the second switch circuit are turned on; and a bias circuit for applying a voltage to the two points of the first voltage dividing circuit such that the first monitor voltage outputted from the first voltage dividing circuit is a predetermined voltage in a state in which the first switch circuit, the second switch circuit, and the third switch circuit are turned off.

According to still further aspect of the present invention, there is provided: a voltage generating circuit for outputting a voltage from an output terminal, comprising: a first voltage dividing circuit which is connected between the output terminal and ground, and outputs a first monitor voltage obtained by resistively dividing the voltage outputted from the output terminal; a first switch circuit connected between the output terminal and the first voltage dividing circuit; a first voltage detecting circuit which compares the first monitor voltage and a reference voltage and outputs a first pumping signal corresponding to a comparison result; a second voltage dividing circuit which is connected between the output terminal and the ground, outputs a second monitor voltage obtained by resistively dividing the voltage outputted from the output terminal, and has a larger resistance than a resistance of the first voltage dividing circuit; a second voltage detecting circuit which compares the second monitor voltage and the reference voltage and outputs a second pumping signal corresponding to a comparison result; a pump circuit that outputs a voltage boosted from a power supply voltage, to the output terminal in response to the first pumping signal or the second pumping signal; a second switch circuit which is connected between the first voltage dividing circuit and the ground, and is controlled so as to be turned on and turned off as the first switch circuit; and a capacitive element connected in parallel with the second switch circuit between the first voltage dividing circuit and the ground.

BRIEF DESCRIPTION OF THE DRAWINGS

FIG. 4 shows the configuration of the active voltage detecting circuit 3a;

DETAILED DESCRIPTION

First, a comparative example will be described below for comparison with the present invention.

Figure 1:
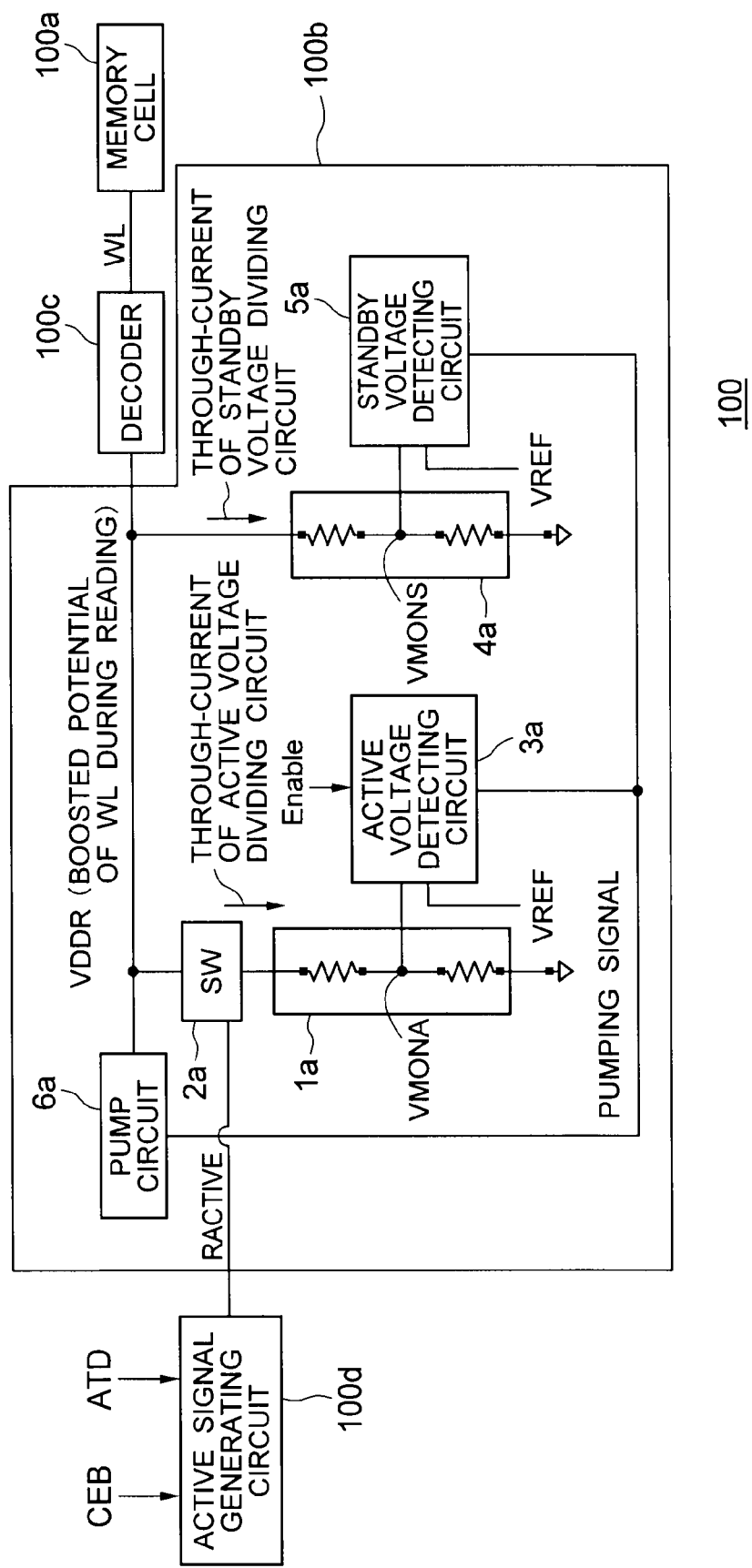
FIG. 1 illustrates an example of the main configuration of a semiconductor memory 100 including a voltage generating circuit serving as the comparative example.

FIG. 1 illustrates an example of the main configuration of a semiconductor memory 100 including a voltage generating circuit serving as the comparative example.

As shown in FIG. 1, for example, the semiconductor memory 100 which is a NOR flash memory includes a memory cell 100a for storing data, a voltage generating circuit 100b for generating a reading voltage, a decoder 100c for applying, to the memory cell 100a, a voltage outputted from the voltage generating circuit 100b, and an active signal generating circuit 100d.

The voltage generating circuit 100b includes an active voltage dividing circuit 1a, a switch circuit 2a, an active voltage detecting circuit 3a, a standby voltage dividing circuit 4a, a standby voltage detecting circuit 5a, and a pump circuit 6a. When the semiconductor memory 100 is an active state, the active voltage dividing circuit 1a and the active voltage detecting circuit 3a are mainly used. When the semiconductor memory 100 is in a standby state, the standby voltage dividing circuit 4a and the standby voltage detecting circuit 5a are mainly used.

For example, in order to keep the level of an output voltage VDDR at a desired potential (the boosted potential of a word line (WL) during reading) during a reading operation of the NOR flash memory, high-speed responsiveness is demanded of the voltage detecting circuit which monitors an output voltage in the voltage generating circuit. In order to obtain high-speed responsiveness, the voltage dividing circuit passes a through-current during detection. The active voltage detecting circuit 3a compares a monitor voltage VMONA generated by the active voltage dividing circuit 1a with a reference voltage VREF and determines whether the level of the output voltage VDDR is higher or lower than a set voltage. When the output voltage VDDR is lower than the set voltage, the pump circuit 6a is activated to boost the output voltage VDDR.

When a reading operation is started, the output voltage VDDR is used for charging the word line. When the reading operation is successively performed, the word line is repeatedly charged and discharged, so that a large amount of charge is consumed from the output of the pump circuit 6a. Since the output voltage VDDR is to be stably kept also in this operation, the switch circuit 2a is turned on to pass a through-current through the active voltage dividing circuit 1a and VMONA serving as a monitor voltage is compared with the reference voltage VREF. Based on the comparison result, the charging or discharging of the output voltage VDDR is performed.

Generally, when a chip is not selected in a semiconductor memory, the semiconductor memory is placed in a standby state in which the current consumption of the chip is minimized. When a chip is selected and an address signal is inputted, data is read (active state). When a change of the address signal is not found (the address signal is not inputted), the semiconductor memory is automatically placed in a standby state and is powered down (auto power down). Current consumption in a standby state has to be suppressed to a specified value of each product or lower.

In this configuration, the through-current passing through the active voltage dividing circuit 1a consumes the output voltage VDDR, so that a current increased by the pumping efficiency of the output voltage VDDR is consumed. In other words, when the NOR flash memory is in a standby state, the through-current kept passing through the active voltage dividing circuit 1a results in larger current consumption than the specified current of a standby state.

It is therefore necessary to interrupt the through-current in a standby state. Thus, for example, the switch circuit 2a of FIG. 1 is controlled to be turned off in a standby state and turned on in an active state. The switch circuit 2a is controlled to be turned on/off in response to a RACTIVE signal generated by the active signal generating circuit 100d. The active signal generating circuit 100d generates the RACTIVE signal based on, for example, the input of a chip enable signal CEB indicating that a chip is selected or based on the input an ATD signal which will be described later.

Since there is a demand for immediate start of a reading operation after recovery from a standby state, it is necessary to keep the level of the output voltage VDDR even in a standby state. Thus a monitor voltage VMONS is generated by the standby voltage dividing circuit 4a which is provided in addition to the active voltage dividing circuit and uses a voltage resistively divided with a small through-current. The monitor voltage VMONS is compared with the reference voltage VREF to determine whether the level of the output voltage VDDR is higher or lower than the set voltage. When the output voltage VDDR is lower than the set voltage, the pump circuit 6a is activated to boost the output voltage VDDR.

The active voltage dividing circuit 1a of the voltage generating circuit 100b shown in FIG. 1 is discharged to a ground potential VSS when the switch circuit 2a is turned off. In other words, in FIG. 1, the terminals of the voltage dividing resistors of the active voltage dividing circuit 1a are discharged to the ground potential VSS during standby.

Figure 2:
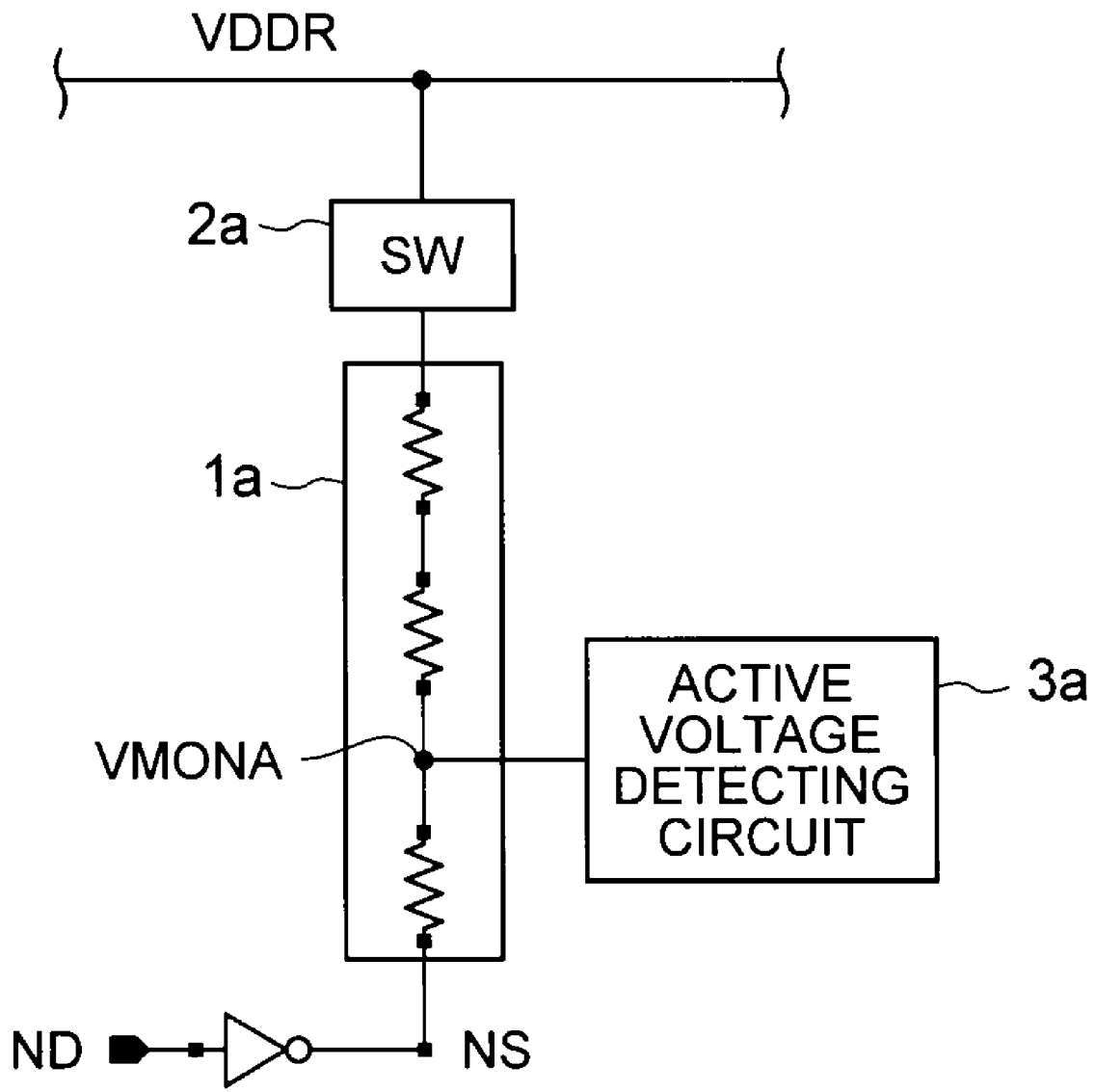
FIG. 2 shows an example in which the terminals of the voltage dividing resistors of the active voltage dividing circuit 1a are charged to a power supply potential VDD during standby.

FIG. 2 shows an example in which the terminals of the voltage dividing resistors of the active voltage dividing circuit 1a are charged to a power supply potential VDD during standby. In the circuit of FIG. 2, the switch circuit 2a is turned off, for example, in a standby state to change the potential of a terminal ND to the ground potential VSS. Thus a power supply voltage is supplied from an inverter to a terminal NS and the terminals of the voltage dividing resistors are charged to the power supply potential VDD.

Figure 3:
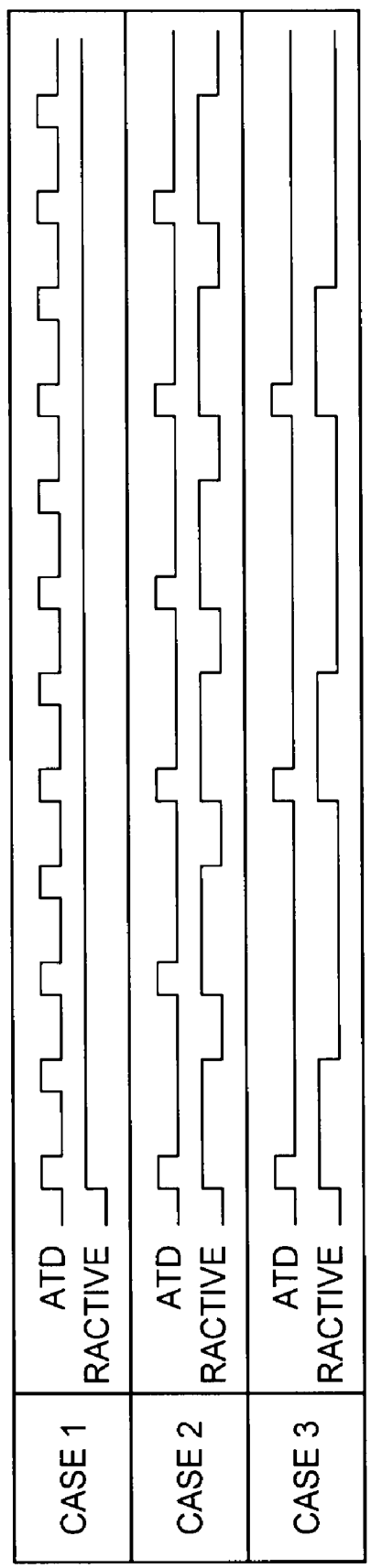
FIG. 3 shows an example of the timing chart of a control signal for controlling the voltage generating circuit 100b of FIG. 1.
Figure 4:
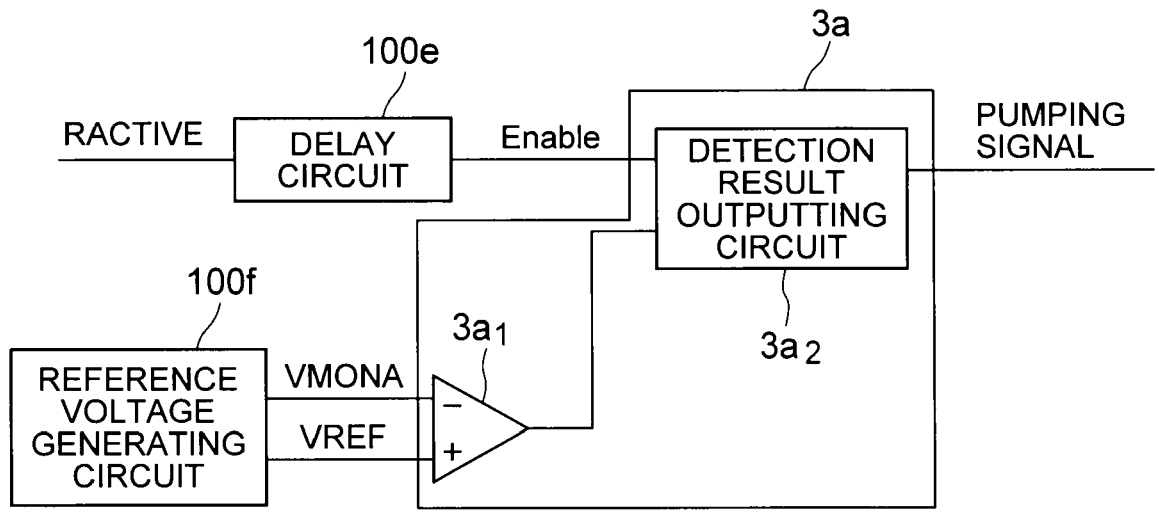

FIG. 3 shows an example of the timing chart of a control signal for controlling the voltage generating circuit 100b of FIG. 1. FIG. 4 shows the configuration of the active voltage detecting circuit 3a. A delay circuit 100e and a reference voltage generating circuit 100f in FIG. 4 are omitted in FIG. 1 for simplification.

In FIG. 3, for example, when the ATD signal for specifying a reading operation becomes "High", the NOR flash memory is placed in a reading state. The ATD signal is generated in response to the detection of a transition (change) of the address signal. When the ATD signal becomes "High", the active signal generating circuit 100d detects the active period (active state) of the reading operation and the RACTIVE signal becomes "High". In response to the RACTIVE signal, the switch circuit 2a is turned on, a through-current passes through the active voltage dividing circuit 1a, and a detecting operation is started.

As illustrated in Case 1 of FIG. 3, when a reading operation is successively performed and the ATD signal is frequently changed, the RACTIVE signal is kept in a "High" state. Thus the switch circuit 2a is always turned on and the through-current keeps passing through the active voltage dividing circuit 1a.

Further, as illustrated in Case 2 of FIG. 3, when a reading operation is performed and then another reading operation is not performed for a certain period (when the ATD signal is not changed for a certain period), the active voltage detecting circuit 3a is automatically powered down. In other words, after a certain period of time, the detection of the output voltage VDDR by the active voltage detecting circuit 3a is stopped.

When the detection is stopped, the switch circuit 2a is turned off to interrupt the through-current of the active voltage dividing circuit 1a and stop a comparison made by an amplifier circuit 3a1 between the reference voltage VREF and the monitor voltage VMONA which are generated by the reference voltage generating circuit 100f of FIG. 4. Thus the standby current of the NOR flash memory can be reduced to the specified standby current.

As illustrated in Case 3 of FIG. 3, when another reading operation is performed after a longer period, the same operation as in Case 2 is performed.

The through-current passing through the active voltage dividing circuit 1a is turned on/off thus in response to the RACTIVE signal, so that the standby current can be reduced to the specified value or lower. However, a certain time is required from when the switch circuit 2a is turned on from a standby state to start passing a current through the active voltage dividing circuit 1a to when the potential of the monitor voltage VMONA reaches a predetermined potential reflecting the output voltage VDDR.

Thus from the start of the passage of current through the active voltage dividing circuit 1a to the stabilization of the potential of the monitor voltage VMONA, the comparison of the amplifier circuit 3a1 of FIG. 4 is stopped. The delay circuit 100e outputs, when the RACTIVE signal is inputted, an Enable signal to the active voltage detecting circuit 3a after a predetermined delay. The delay time of the delay circuit 100e is properly set in consideration of a time before the potential of the monitor voltage VMONA is stabilized.

In response to the Enable signal, a detection result outputting circuit 3a2 of the active voltage detecting circuit 3a outputs, as a pumping signal, a result reflecting the comparison result of the monitor voltage VMONA and the reference voltage VREF. The pump circuit 6a performs a boosting operation based on the pumping signal and boosts the output voltage VDDR (the word line WL potential required for reading).

The amplifier circuit 3a1 also passes a through-current during an operation. Thus in response to the RACTIVE signal, the amplifier circuit 3a1 is operated in an active state and is stopped in a standby state by resetting a voltage in the amplifier circuit 3a1.

The following will describe a possible problem occurring when it takes a long time before the potential of the monitor voltage VMONA reaches (stabilizes at) the predetermined potential reflecting the output voltage VDDR.

First, the following will describe the circuit configuration of FIG. 1 in which the switch circuit 2a is turned off in a standby state and the active voltage dividing circuit 1a is discharged to the ground potential VSS.

Figure 5:
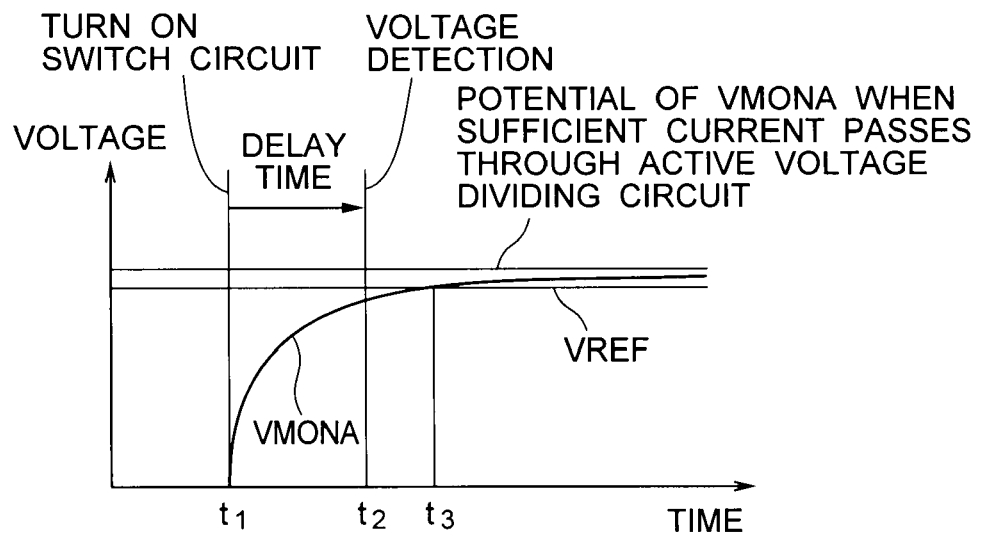
FIG. 5 shows the relationship between the monitor voltage VMONA outputted from the active voltage dividing circuit 1a and the reference voltage VREF when the output voltage VDDR is higher than the set voltage.

FIG. 5 shows the relationship between the monitor voltage VMONA outputted from the active voltage dividing circuit 1a and the reference voltage VREF when the output voltage VDDR is higher than the set voltage.

As shown in FIG. 5, the switch circuit 2a is turned on in response to the RACTIVE signal (time t1). After a predetermined delay time (times t1 to t2) of the delay circuit 100e, the active voltage detecting circuit 3a outputs a detection result (times t2 to t3) before a sufficient current passes through the active voltage dividing circuit 1a and the monitor voltage VMONA reaches the original level higher than the reference voltage VREF. As a result, the pump circuit 6a is operated to further boost the output voltage VDDR, though the level of the output voltage VDDR is at a set level or higher (erroneous determination). Thus the output voltage VDDR may become higher than a desired level.

Figure 6:
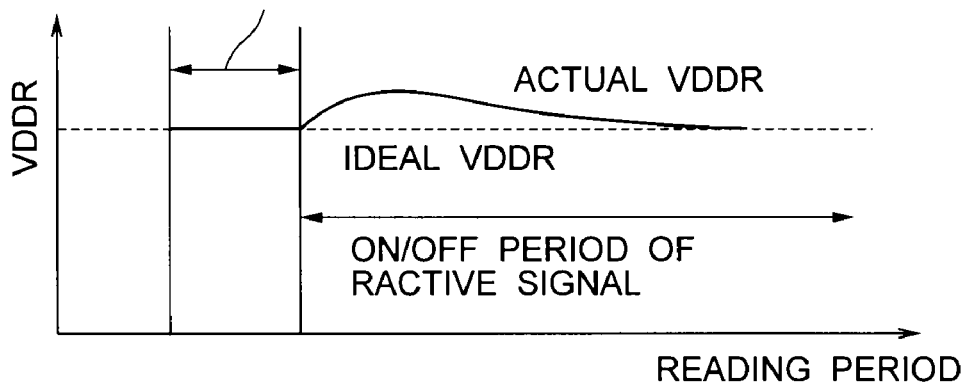
FIG. 6 shows the relationship between the potential of an ideal output voltage VDDR and the potential of an actual output voltage VDDR in the case of FIG. 5.

FIG. 6 shows the relationship between the potential of an ideal output voltage VDDR and the potential of an actual output voltage VDDR in the case of FIG. 5. As shown in FIG. 6, in a period during which the RACTIVE signal is repeatedly turned on/off, the output voltage VDDR is continuously boosted by the pump circuit 6a because the erroneous determination is repeated. Thus the actual output voltage VDDR becomes higher than the ideal output voltage VDDR.

The following will describe the circuit configuration of FIG. 2 in which the switch circuit 2a is turned off to charge the active voltage dividing circuit 1a to the power supply potential VDD in a standby state.

Figure 7:
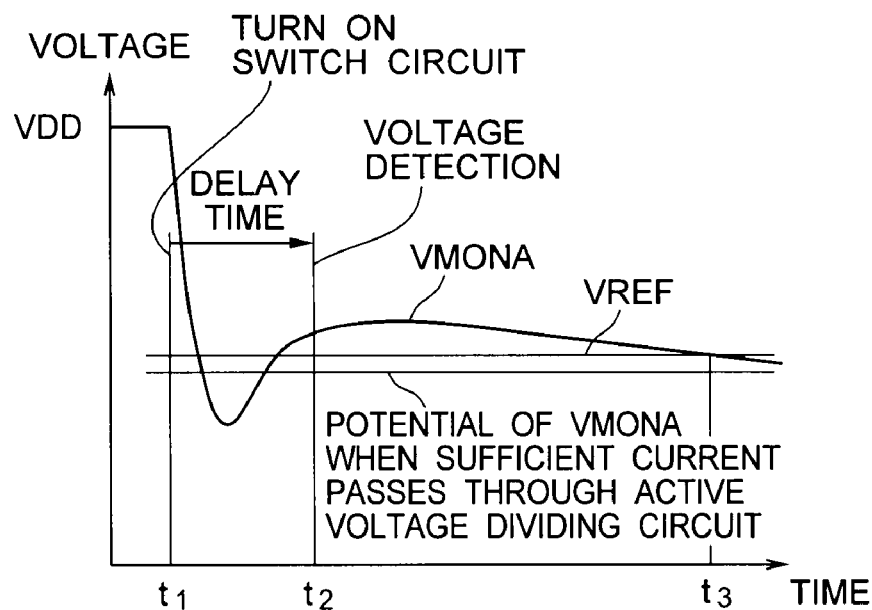
FIG. 7 shows the relationship between the monitor voltage VMONA outputted from the active voltage dividing circuit 1a and the reference voltage VREF in a state in which the output voltage VDDR is lower than the set voltage.

FIG. 7 shows the relationship between the monitor voltage VMONA outputted from the active voltage dividing circuit 1a and the reference voltage VREF in a state in which the output voltage VDDR is lower than the set voltage.

As shown in FIG. 7, the switch circuit 2a is turned on in response to the RACTIVE signal (time t1). After the predetermined delay time (times t1 to t2) of the delay circuit 100e, the active voltage detecting circuit 3a outputs a detection result (times t2 to t3) before a sufficient current passes through the active voltage dividing circuit 1a and the monitor voltage VMONA reaches the original level lower than the reference voltage VREF. As a result, the pump circuit 6a is not operated and the output voltage VDDR is not boosted, though the level of the output voltage VDDR is at the set level or lower (erroneous determination). Thus the output voltage VDDR may become lower than the desired level.

Figure 8:
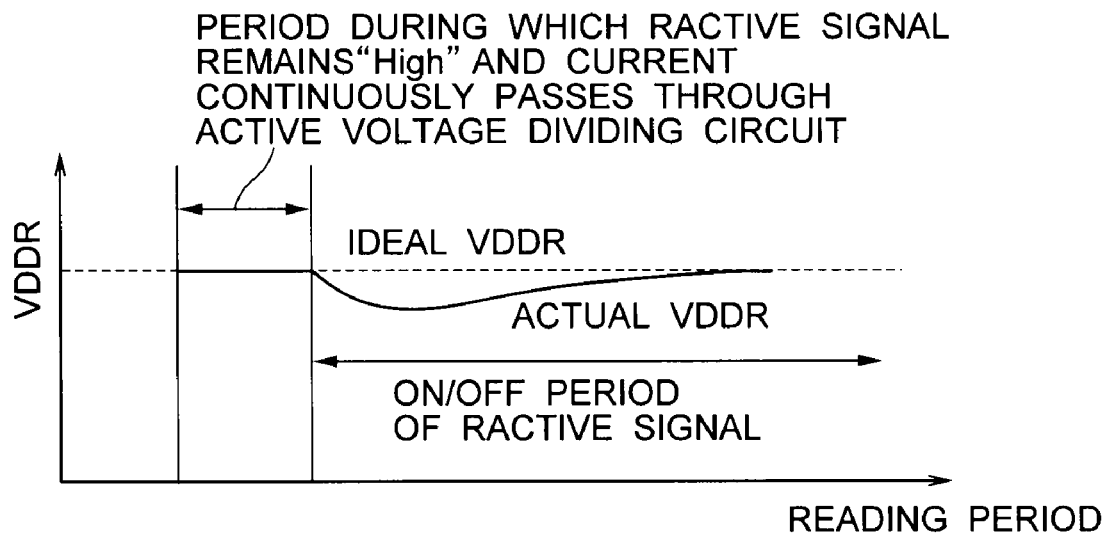
FIG. 8 shows the relationship between the potential of an ideal output voltage VDDR and the potential of an actual output voltage VDDR in the case of FIG. 7.

FIG. 8 shows the relationship between the potential of an ideal output voltage VDDR and the potential of an actual output voltage VDDR in the case of FIG. 7. As shown in FIG. 8, in a period during which the RACTIVE signal is repeatedly turned on/off, the pump circuit 6a is not operated because the erroneous determination is repeated. Thus the actual output voltage VDDR becomes lower than the ideal output voltage VDDR.

As shown in FIGS. 5 and 7, it takes a certain time before the active voltage dividing circuit outputs the predetermined monitor voltage VMONA reflecting the output voltage VDDR. This is because the voltage dividing resistors composing the active voltage dividing circuit have parasitic capacitances (for example, a junction capacitance, a wiring capacitance, and so on). In other words, even when MOS transistors composing a switch circuit are increased in size, it takes a long time for the monitor voltage to change according to the time constant of RC, so that the foregoing problem may occur.

Further, as shown in FIGS. 6 and 8, in a period during which the RACTIVE signal is interrupted and the switch circuit 2a is repeatedly turned on/off, the level of the actual output voltage VDDR is deviated from the level of the ideal output voltage VDDR particularly in a section having a relatively short reading period (for example, Case 2 of FIG. 3). When the output voltage VDDR is deviated from the desired level, it is difficult to respond to, for example, the multiple levels of the NOR flash memory in which accuracy is necessary for the output voltage VDDR.

This is because in multilevel technology for storing information of multiple bits in a memory cell, a voltage difference between adjacent threshold distributions is smaller than that in binary technology and thus a reading operation cannot be started until the output voltage VDDR is stabilized. If a reading operation is started before the output voltage VDDR is stabilized, data may be erroneously read. Thus it is important to correctly control the pump circuit 6a by changing the monitor voltage VMONA to the original level as early as possible, and stabilize the output voltage VDDR with high accuracy.

Moreover, the standby voltage dividing circuit 4a and the active voltage dividing circuit 1a of the comparative example have different through-currents and the voltage dividing resistors are differently sized. Thus these voltage dividing resistors are dependent on a back bias.

For example, in the prior art, voltage dividing resistors are configured in a shared well. When using N-channel voltage dividing resistors configured in a P-type well, the P-type well is biased to the ground potential VSS. In other words, in all of the voltage dividing resistors, the potential of the P-type well is biased to the ground potential VSS.

Figure 9:
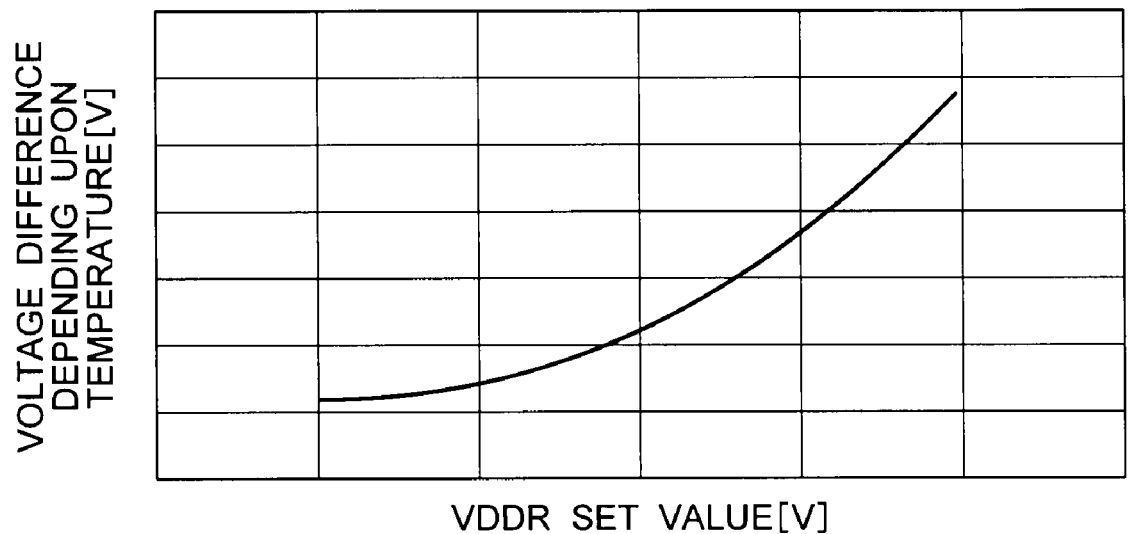
FIG. 9 shows the relationship between a set value (set voltage) [V] of the output voltage VDDR and a voltage difference [V] of the output voltage VDDR relative to a temperature when the voltage dividing resistors of the prior art are used.

FIG. 9 shows the relationship between a set value (set voltage) [V] of the output voltage VDDR and a voltage difference [V] of the output voltage VDDR relative to a temperature when the voltage dividing resistors of the prior art are used. As shown in FIG. 9, even when the reference voltage VREF remains constant, a difference in the output voltage VDDR dependent upon a temperature increases with the set value.

Since the voltage dividing resistors vary in back bias thus, the setting is difficult.

In response to the problems found by the applicant in the comparative example, embodiments to which the present invention is applied will be described below in accordance with the accompanying drawings.

The following embodiments will describe examples of a voltage generating circuit applied to, for example, a NOR flash memory which is a semiconductor memory. The voltage generating circuit of the present invention is also applicable to other semiconductor memories and semiconductor integrated circuits requiring boosted voltages.

First Embodiment

Figure 10:
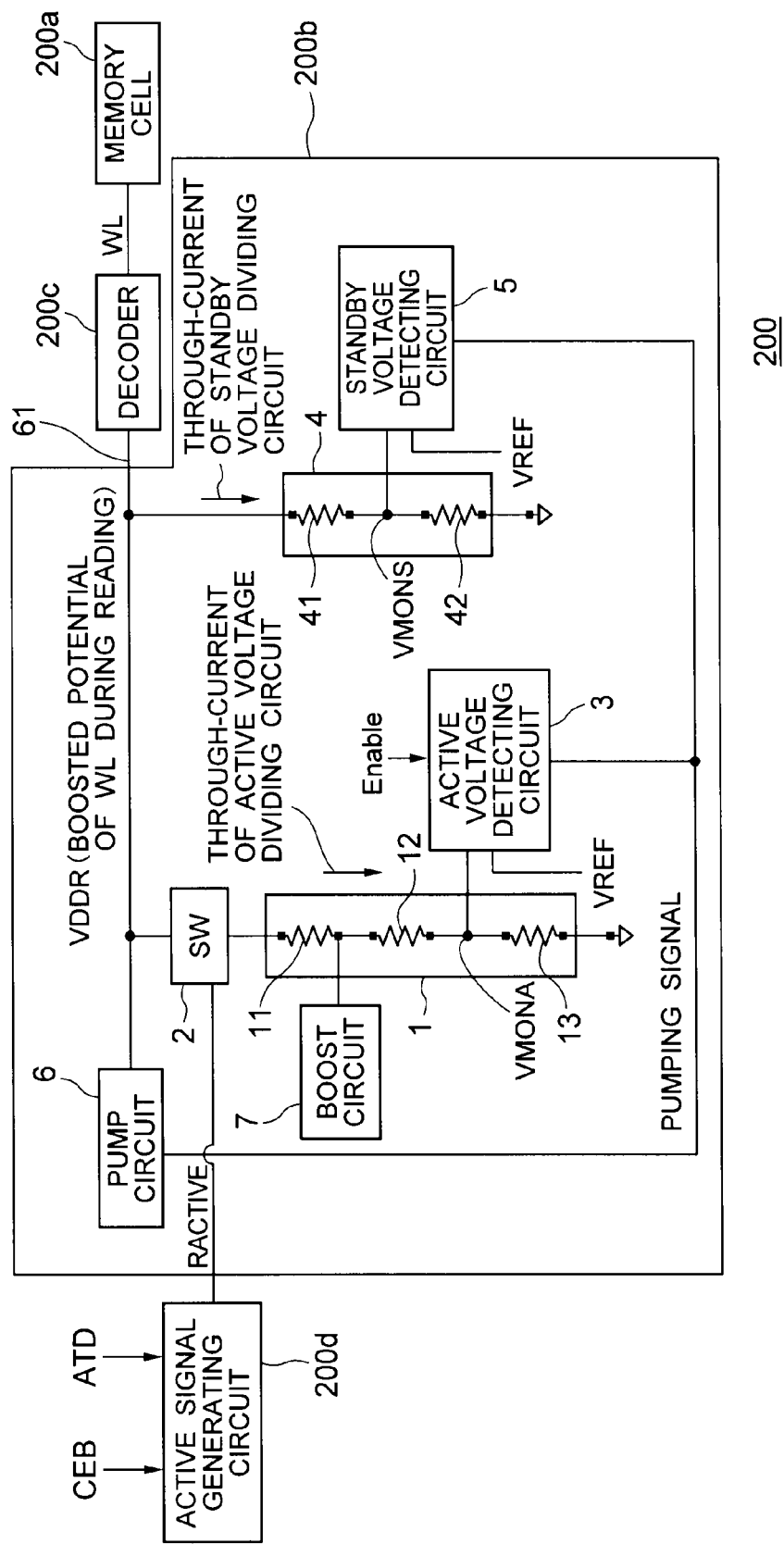
FIG. 10 shows an example of the configuration of a semiconductor memory 200 including a voltage generating circuit according to a first embodiment which is an aspect of the present invention.

FIG. 10 shows an example of the configuration of a semiconductor memory 200 including a voltage generating circuit according to a first embodiment which is an aspect of the present invention.

As shown in FIG. 10, the semiconductor memory 200 includes a memory cell 200a for storing data, a voltage generating circuit 200b for generating a reading voltage and outputting the voltage to an output terminal (output node) 61, a decoder 200c for applying, to the memory cell 200a, the voltage outputted from the voltage generating circuit 200b, and an active signal generating circuit 200d. The memory cell 200a and the decoder 200c are configured as in the comparative example.

The voltage generating circuit 200b includes an active voltage dividing circuit (first voltage dividing circuit) 1, a switch circuit 2, an active voltage detecting circuit (first voltage detecting circuit) 3, a standby voltage dividing circuit (second voltage dividing circuit) 4, a standby voltage detecting circuit (second voltage detecting circuit) 5, a pump circuit 6, and a boost circuit 7. The switch circuit 2, the standby voltage dividing circuit 4, the standby voltage detecting circuit 5, and the pump circuit 6 are configured as in the comparative example.

The active voltage dividing circuit 1 is connected between the output terminal 61 and the ground. The active voltage dividing circuit 1 outputs a monitor voltage VMONA obtained by dividing a voltage VDDR outputted from the output terminal 61. The voltage VDDR is divided by voltage dividing resistors 11, 12, and 13 connected in series. In this configuration, a potential between the voltage dividing resistor 12 and the voltage dividing resistor 13 is outputted as the monitor voltage VMONA.

The switch circuit 2 is connected between the output terminal 61 and the first voltage dividing circuit 1.

The active voltage detecting circuit 3 compares the monitor voltage VMONA and a reference voltage VREF, and outputs a pumping signal (first pumping signal) corresponding to the comparison result. For example, when the monitor voltage VMONA is lower than the reference voltage VREF, a pumping signal for activating the pump circuit 6 is outputted. When the monitor voltage VMONA is higher than the reference voltage VREF, a pumping signal for deactivating the pump circuit 6 is outputted.

The active voltage detecting circuit 3 is activated in response to an Enable signal which was described in the comparative example.

The standby voltage dividing circuit 4 is connected between the output terminal 61 and the ground. The standby voltage dividing circuit 4 outputs a monitor voltage VMONS obtained by dividing the voltage VDDR outputted from the output terminal 61. The voltage VDDR is divided by voltage dividing resistors 41 and 42 connected in series. In this configuration, a potential between the voltage dividing resistor 41 and the voltage dividing resistor 42 is outputted as the monitor voltage VMONS.

The combined resistance of the voltage dividing resistors 41 and 42 in the standby voltage dividing circuit 4 is set larger than the combined resistance of the voltage dividing resistors 11, 12, and 13 in the active voltage dividing circuit 1. Thus a through-current passing through the standby voltage dividing circuit 4 is smaller than a through-current passing through the active voltage dividing circuit 1.

The standby voltage detecting circuit 5 compares the monitor voltage VMONS and the reference voltage VREF, and outputs a pumping signal (second pumping signal) corresponding to the comparison result. For example, when the monitor voltage VMONS is lower than the reference voltage VREF, a pumping signal for activating the pump circuit 6 is outputted. When the monitor voltage VMONS is higher than the reference voltage VREF, a pumping signal for deactivating the pump circuit 6 is outputted.

The pump circuit 6 outputs a voltage boosted from a power supply potential VDD to the output terminal 61, in response to at least one of the pumping signal outputted from the active voltage detecting circuit 3 and the pumping signal outputted from the standby voltage detecting circuit 5. The active voltage detecting circuit 3 and the standby voltage detecting circuit 5 may each include a pump circuit.

The boost circuit 7 has an output connected between the voltage dividing resistor 11 and the voltage dividing resistor 12 of the active voltage dividing circuit 1. The boost circuit 7 boosts a voltage between the voltage dividing resistor 11 and the voltage dividing resistor 12 at a time when the switch circuit 2 is switched from off (standby state) to on (active state).

Figure 11:
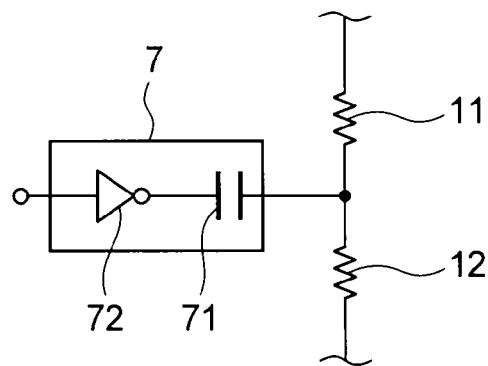
FIG. 11 shows an example of the configuration of the boost circuit 7 of the voltage generating circuit 200b shown in FIG. 10.

FIG. 11 shows an example of the configuration of the boost circuit 7 of the voltage generating circuit 200b shown in FIG. 10. As shown in FIG. 11, the boost circuit 7 includes, for example, a capacitive element 71 having one end connected to the voltage dividing resistor 11 (the voltage dividing circuit 12) of the active voltage dividing circuit 1 and an inverter 72 having an output connected to the other end of the capacitive element 71.

The boost circuit 7 changes the input of the inverter 72 from "High" (power supply potential VDD) to "Low" (ground potential VSS) at a time when the switch circuit 2 is switched from off to on. The change of the output of the inverter 75 increases an amount of charge on one end of the capacitive element 71 as the other end of the capacitive element 71 is charged from the ground potential VSS to the power supply potential VDD. In other words, a voltage between the voltage dividing resistor 11 and the voltage dividing resistor 12 is boosted at a time when the switch circuit 2 is switched from off to on.

A potential between the voltage dividing resistor 11 and the voltage dividing resistor 12 is determined by the capacitance of the capacitive element 71 and the parasitic capacitances of the voltage dividing resistor 11 and the voltage dividing resistor 12. The potential is substantially boosted to the power supply potential VDD when the capacitance of the capacitive element 71 is sufficiently larger than the parasitic capacitances of the voltage dividing resistor 11 and the voltage dividing resistor 12.

Figure 12:
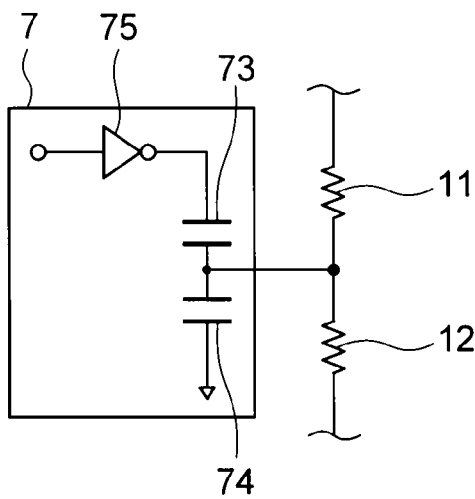
FIG. 12 shows another example of the configuration of the boost circuit 7 of the voltage generating circuit 200b shown in FIG. 10.

FIG. 12 shows another example of the configuration of the boost circuit 7 of the voltage generating circuit 200b shown in FIG. 10. As shown in FIG. 12, the boost circuit 7 includes, for example, a capacitive element 73 having one end connected to the voltage dividing resistor 11 (voltage dividing resistor 12), a capacitive element 74 connected between the one end of the capacitive element 73 and the ground, and an inverter 75 having an output connected to the other end of the capacitive element 73. The boost circuit 7 outputs a voltage obtained by dividing the output voltage of the inverter 75 through the capacitive elements 73 and 74, between the voltage dividing resistor 11 and the voltage dividing resistor 12.

As in the example of FIG. 11, the boost circuit 7 changes the input of the inverter 75 from "High" (power supply potential VDD) to "Low" (ground potential VSS) at a time when the switch circuit 2 is switched from off to on. The change of the output of the inverter 75 boosts a voltage on one end of the capacitive element 73 as the other end of the capacitive element 73 is charged from the ground potential VSS to the power supply potential VDD. In other words, a voltage between the voltage dividing resistor 11 and the voltage dividing resistor 12 is boosted at a time when the switch circuit 2 is switched from off to on.

When the capacitances of the capacitive element 73 and the capacitive element 74 are sufficiently larger than the parasitic capacitances of the voltage dividing resistors, it is possible to set a desired potential between the voltage dividing resistor 11 and the voltage dividing resistor 12 by properly setting a ratio of the capacitive element 73 and the capacitive element 74. For example, when the capacitance ratio of the capacitive element 73 and the capacitive element 74 is 1 to 1, the voltage dividing resistors can be boosted to a half of the power supply potential VDD.

Figure 13:
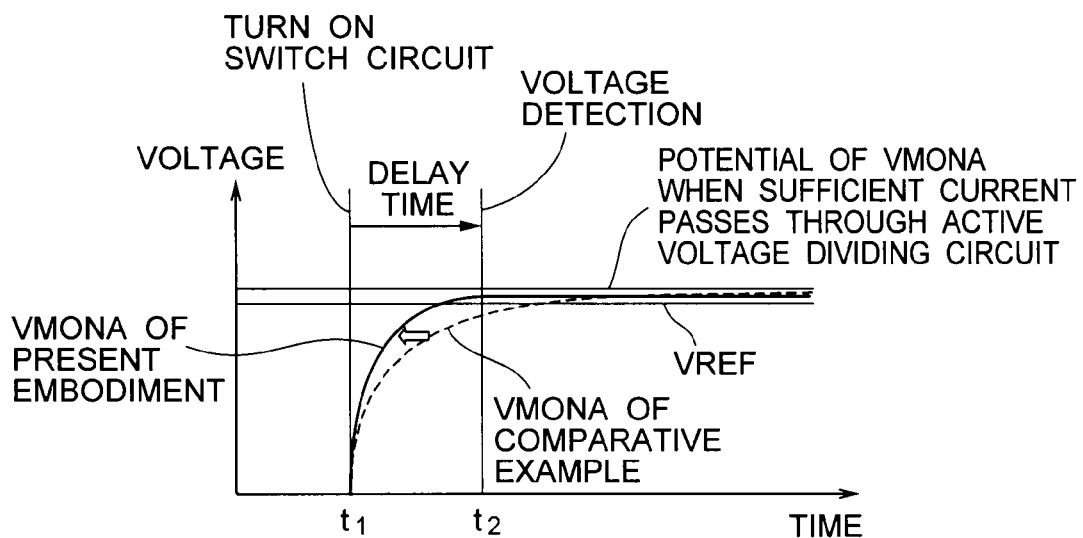
FIG. 13 shows the relationship between the monitor voltage VMONA outputted from the active voltage dividing circuit 1 and the reference voltage VREF in a state in which the output voltage VDDR is higher than the set voltage.

FIG. 13 shows the relationship between the monitor voltage VMONA outputted from the active voltage dividing circuit 1 and the reference voltage VREF in a state in which the output voltage VDDR is higher than the set voltage. As described above, the boost circuit 7 boosts (charges) the voltages of the voltage dividing resistors at a time when the switch circuit 2 is switched from off (standby state) to on (active state). Thus when the switch circuit 2 is turned on (changes to an active state), the monitor voltage VMONA outputted from the active voltage dividing circuit 1 changes to a predetermined voltage reflecting the output voltage VDDR in a shorter time than in the comparative example.

It is therefore possible to correctly control the operation of the pump circuit 6 earlier in an active state. In other words, it is possible to suppress an erroneous determination of the active voltage detecting circuit 3 and operate the pump circuit 6 at a proper time. Thus the voltage generating circuit 200b can keep the output voltage VDDR at a desired level with higher accuracy than in the comparative example.

As described above, the voltage generating circuit of the present embodiment can output a desired voltage with higher accuracy. Thus, for example, it is possible to quickly start the reading operation of the NOR flash memory or improve the margin of the reading operation.

Second Embodiment

In the first embodiment, the voltage dividing resistors of the active voltage dividing circuit 1 are boosted by the boost circuit 7 at the transition from a standby state to an active state. The first embodiment described an example of the configuration of the voltage generating circuit in which a voltage is correctly detected earlier and an output voltage is controlled with high accuracy.

In the present embodiment, a predetermined voltage is inputted to and kept in an active voltage detecting circuit 1 until a monitor voltage VMONA generated by the active voltage detecting circuit 1 is stabilized. The following will describe an example of the configuration of a voltage generating circuit for stabilizing, in a shorter time, a voltage inputted to a voltage detecting circuit.

Figure 14:
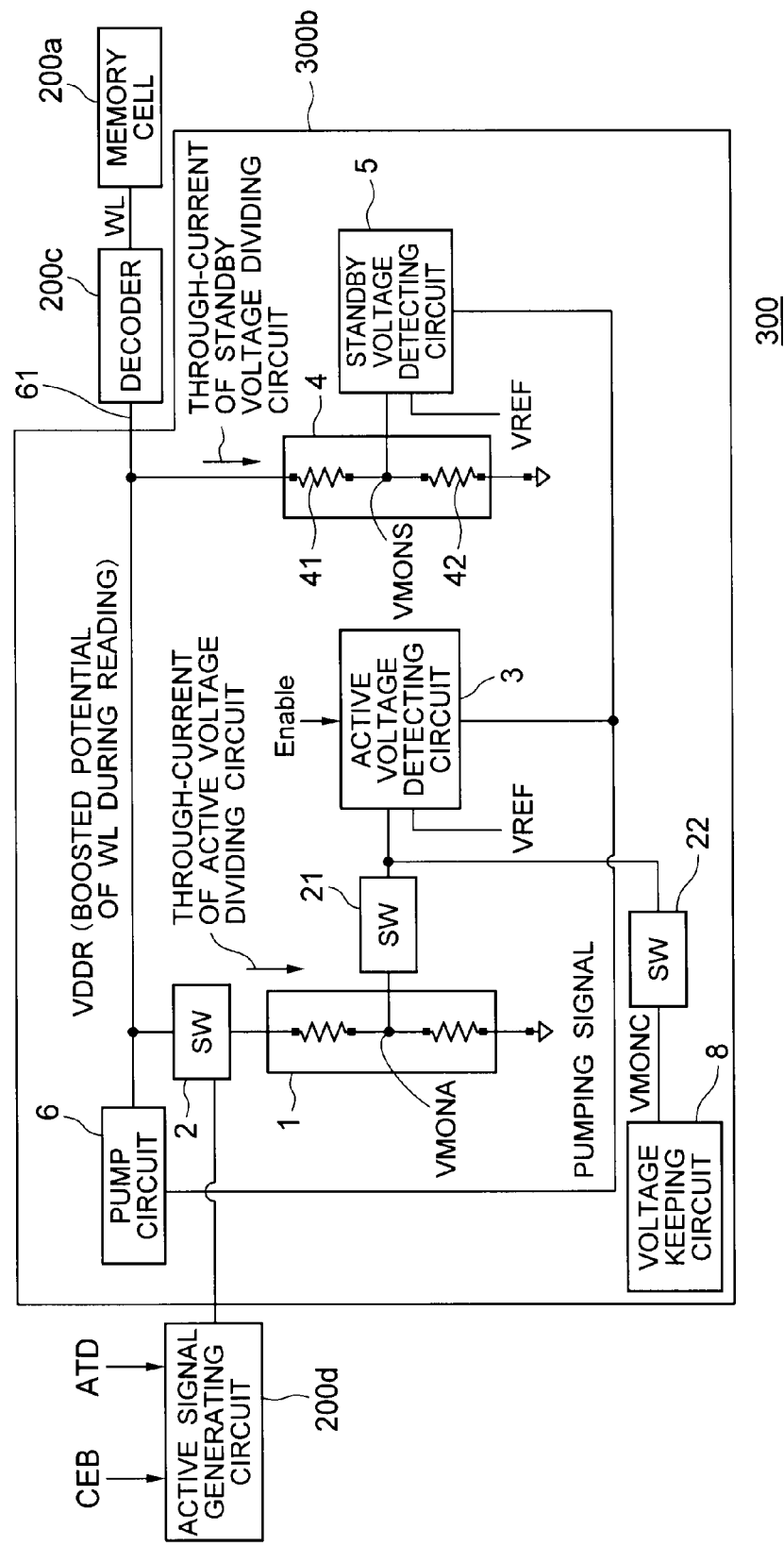
FIG. 14 shows an example of the configuration of a semiconductor memory 300 including the voltage generating circuit according to a second embodiment which is an aspect of the present invention.

FIG. 14 shows an example of the configuration of a semiconductor memory 300 including the voltage generating circuit according to a second embodiment which is an aspect of the present invention. Configurations indicated by the same reference numerals as the first embodiment are similar to the configurations of the first embodiment.

As shown in FIG. 14, a voltage generating circuit 300b includes the active voltage dividing circuit 1, a switch circuit 2, an active voltage detecting circuit 3, a standby voltage dividing circuit 4, a standby voltage detecting circuit 5, a pump circuit 6, a voltage keeping circuit 8, a switch circuit 21, and a switch circuit 22.

The voltage keeping circuit 8 outputs a voltage VMONC and keeps a voltage inputted to the active voltage detecting circuit 3. The voltage VMONC is, for example, a voltage equal to the monitor voltage VMONA before switching to a standby state, a voltage equal to a reference voltage VREF, and so on.

The switch circuit 21 is connected between the output of the active voltage dividing circuit 1 and the input of the active voltage detecting circuit 3. The switch circuit 22 is connected among the output of the voltage keeping circuit 8, the input of the active voltage detecting circuit 3, and the switch circuit 21.

The following will describe an operation example in which voltages inputted to the active voltage detecting circuit 3 of the voltage generating circuit 300b are switched.

For example, in a standby state, the switch circuits 2 and 21 are turned off and only the switch circuit 22 is turned on. Thus the voltage VMONC is inputted to and kept in the active voltage detecting circuit 3, instead of the monitor voltage VMONA.

Next, when switching from a standby state to an active state, the switch circuit 2 is turned on to start passing a through-current through the active voltage dividing circuit 1. After that, the switch circuit 21 is turned on when the monitor voltage VMONA outputted from the active voltage dividing circuit 1 is stabilized. Thus the monitor voltage VMONA (detected voltage) reflecting the level of an output voltage VDDR is inputted to the active voltage detecting circuit 3.

In the case of switching from a standby state to an active state, the voltage VMONC is inputted to the active voltage detecting circuit 3 until the active voltage dividing circuit 1 outputs a desired (stable) monitor voltage VMONA. Since the voltage VMONC is set around the reference voltage VREF as described above, a voltage inputted to the active voltage detecting circuit 3 at the turn-on of the switch circuit 21 can be changed in a shorter time to a predetermined potential reflecting the output voltage VDDR. It is therefore possible to output a desired pumping signal earlier.

In other words, the voltage generating circuit 300b can output a desired voltage with higher accuracy than in the comparative example.

The switch circuit 22 may be turned off when the switch circuit 21 is turned on. Further, the switch circuit 22 may be turned off after the stable monitor voltage VMONA is inputted to the active voltage detecting circuit 3, or the switch circuit 22 may be kept turned on.

Figure 15A:
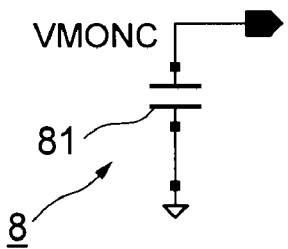
FIG. 15A shows an example of the configuration of the voltage keeping circuit in the voltage generating circuit of FIG. 14.

FIG. 15A shows an example of the configuration of the voltage keeping circuit in the voltage generating circuit of FIG. 14.

As shown in FIG. 15A, the voltage keeping circuit 8 includes a capacitive element 81 having one end connected to the switch circuit 22 and the other end connected to the ground. By turning on the switch circuits 21 and 22 in, for example, an active state (when the switch circuit 2 is turned on), the capacitive element 81 is charged to the monitor voltage VMONA at that time.

Figure 15B:
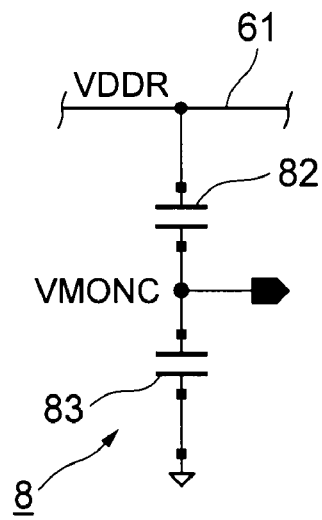
FIG. 15B shows another example of the configuration of the voltage keeping circuit in the voltage generating circuit of FIG. 14.

FIG. 15B shows another example of the configuration of the voltage keeping circuit in the voltage generating circuit of FIG. 14. As shown in FIG. 15B, the voltage keeping circuit 8 includes a capacitive element 82 having one end connected to the switch circuit 22 and the other end connected to an output terminal 61, and a capacitive element 83 connected between the one end of the capacitive element 82 and the ground. A voltage between the capacitive element 82 and the capacitive element 83 is outputted as the voltage VMONC.

In the voltage keeping circuit 8 of FIG. 15B, the capacitance values of the capacitive elements 82 and 83 are set so as to have the same voltage dividing ratio as the active voltage dividing circuit 1. Thus the voltage generating circuit 8 divides the output voltage VDDR and keeps the voltage VMONC as high as the monitor voltage VMONA.

Figure 15C:
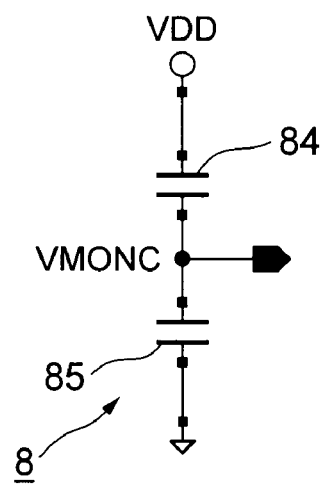
FIG. 15C shows still another example of the configuration of the voltage keeping circuit in the voltage generating circuit of FIG. 14.

FIG. 15C shows still another example of the configuration of the voltage keeping circuit in the voltage generating circuit of FIG. 14. As shown in FIG. 15C, the voltage keeping circuit 8 includes a capacitive element 84 having one end connected to the switch circuit 22 and the other end connected to a power supply potential VDD, and a capacitive element 85 connected between the one end of the capacitive element 84 and the ground. A voltage between the capacitive element 84 and the capacitive element 85 is outputted as the voltage VMONC.

In the voltage keeping circuit 8 of FIG. 15C, the capacitance values of the capacitive elements 84 and 85 are set such that a voltage value obtained by dividing the power supply potential VDD through the capacitive elements 84 and 85 is equal to, for example, the reference voltage VREF. Thus, in this case, the voltage generating circuit 8 keeps the voltage VMONC as high as the reference voltage VREF.

The above circuit configurations of the voltage keeping circuit 8 were simply described as examples. Any circuit configuration is applicable as long as at least a voltage inputted to the active voltage detecting circuit 3 can be kept. For example, a voltage to be kept may be inputted from another circuit (not shown) to the voltage keeping circuit 8.

As described above, the voltage generating circuit of the present embodiment can output a desired voltage with higher accuracy.

Third Embodiment

The first and second embodiments described examples of the configuration of the voltage generating circuit for detecting a voltage with higher accuracy by controlling the potential of the active voltage dividing circuit 1.

The present embodiment will describe an example of the configuration of a voltage generating circuit for detecting a voltage with higher accuracy by alternately switching and controlling potentials of an active voltage dividing circuit 1 in each active state.

Figure 16:
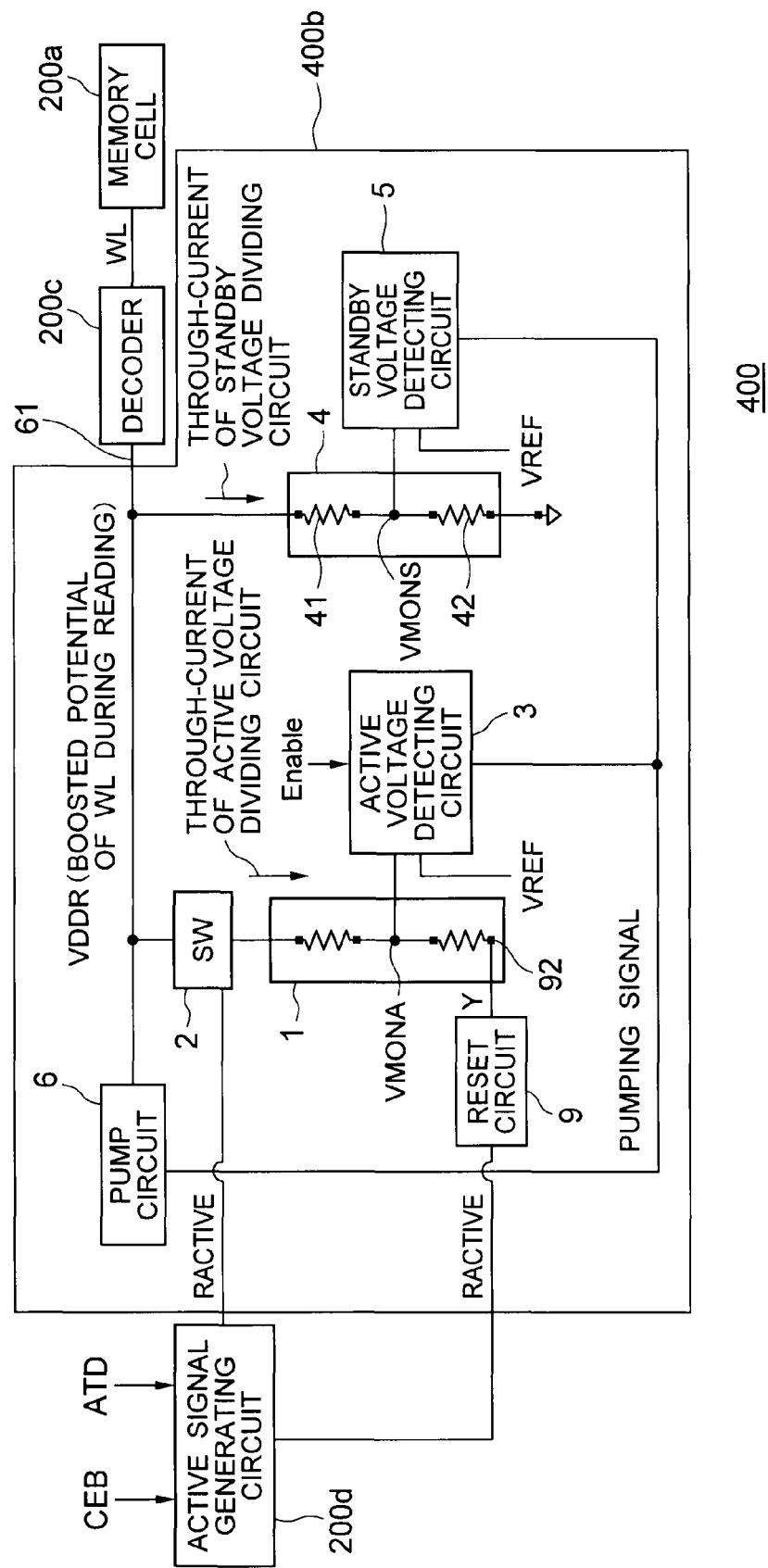
FIG. 16 shows an example of the configuration of a semiconductor memory 400 including the voltage generating circuit according to a third embodiment which is an aspect of the present invention.

FIG. 16 shows an example of the configuration of a semiconductor memory 400 including the voltage generating circuit according to a third embodiment which is an aspect of the present invention. Configurations indicated by the same reference numerals as the first embodiment are similar to the configurations of the first embodiment.

As shown in FIG. 16, a voltage generating circuit 400b includes an active voltage dividing circuit 1, a switch circuit 2, an active voltage detecting circuit 3, a standby voltage dividing circuit 4, a standby voltage detecting circuit 5, a pump circuit 6, and a reset circuit 9.

The reset circuit 9 is connected to the other end (terminal 92) of the active voltage dividing circuit 1. The reset circuit 9 applies one of a first voltage higher than a reference voltage VREF and a second voltage lower than the reference voltage VREF to the other end of the active voltage dividing circuit 1 while the switch circuit 2 is turned off (standby state). The first voltage is, for example, a power supply potential VDD and the second voltage is, for example, a ground potential VSS.

The reset circuit 9 applies the second voltage to the other end of the active voltage dividing circuit 1 while the switch circuit 2 is turned on (active state). Thus in an active state, a through-current passes through the active voltage dividing circuit 1 and a detecting operation can be performed by a monitor voltage VMONA.

Further, when the switch circuit 2 is switched from on to off (changes from an active state to a standby state), the reset circuit 9 switches, to one of the first voltage and the second voltage, a voltage applied to the other end of the active voltage dividing circuit 1 while the switch circuit 2 is turned off.

As shown in FIG. 16, when the switch circuit 2 is switched from on to off, the reset circuit 9 applies a signal Y having one of the first voltage and the second voltage to the terminal 92.

Thus the voltage dividing resistors of the active voltage dividing circuit 1 are charged or discharged.

Figure 17A:
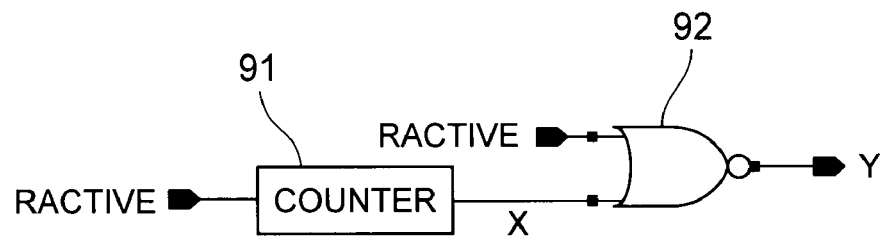
FIG. 17A shows an example of the configuration of the reset circuit 9 shown in FIG. 16.

FIG. 17A shows an example of the configuration of the reset circuit 9 shown in FIG. 16. As shown in FIG. 17A, the reset circuit 9 includes a counter 92 which is fed with a RACTIVE signal and inverts, at the rising edge of the RACTIVE signal, the phase of a signal X serving as an output signal, and a NOR circuit 93 which is fed with the RACTIVE signal and the signal X and outputs the signal Y.

Figure 17B:
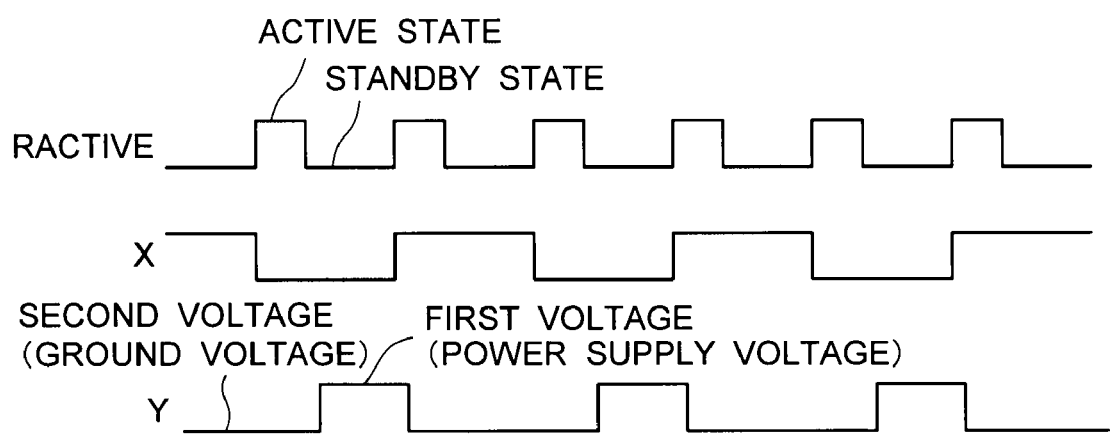
FIG. 17B is a timing chart of the signals inputted and outputted to and from the reset circuit 9 having the circuit configuration of FIG. 17A.

FIG. 17B is a timing chart of the signals inputted and outputted to and from the reset circuit 9 having the circuit configuration of FIG. 17A. In FIG. 17B, the RACTIVE signal at "High" indicates an active state and the RACTIVE signal at "Low" indicates a standby state. The signal Y at "High" indicates the first voltage and the signal Y at "Low" indicates the second voltage.

As shown in FIG. 17B, the phase of the signal Y outputted from the reset circuit 9 is one of the first voltage and the second voltage while the switch circuit 2 is turned off (standby state). The phase of the signal Y is the second voltage while the switch circuit 2 is turned on (active state).

The phase of the signal Y is switched to the second voltage at a time when the switch circuit 2 is switched from on to off (changes from an active state to a standby state). The phase of the signal Y may be switched to the first voltage by inverting, for example, the output of the counter 92 at a time when the phase of the signal Y is switched from on to off (changes from an active state to a standby state).

Figure 18A:
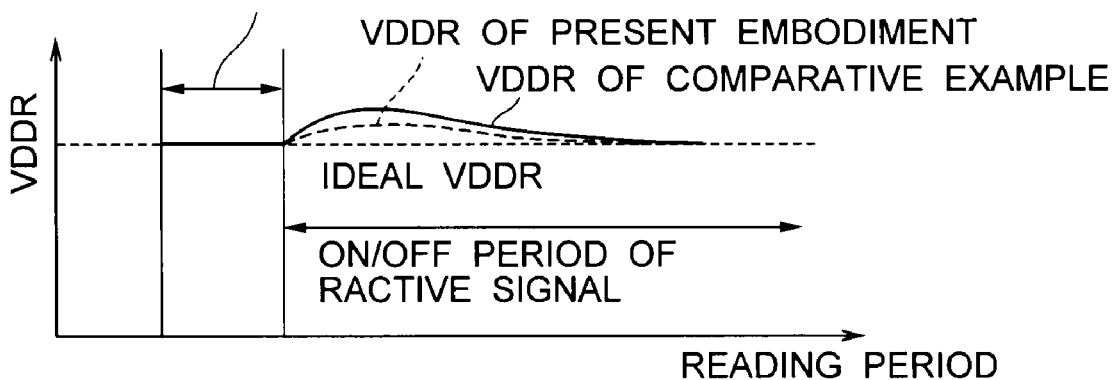
FIG. 18A shows the relationship among the potentials of an ideal output voltage VDDR, an output voltage VDDR of the present embodiment, and an output voltage VDDR of the comparative example.
Figure 18B:
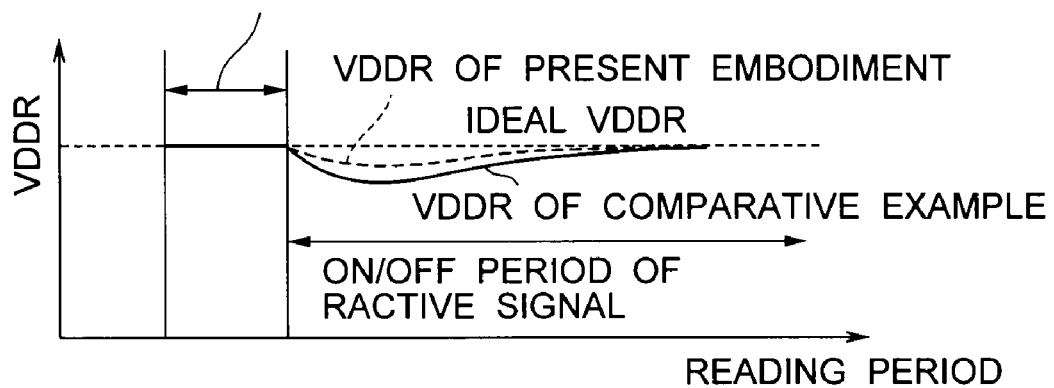
FIG. 18B shows the relationship among the potentials of an ideal output voltage VDDR, an output voltage VDDR of the present embodiment, and an output voltage VDDR of the comparative example.

FIGS. 18A and 18B show the relationships among the potentials of an ideal output voltage VDDR, an output voltage VDDR of the present embodiment, and an output voltage VDDR of the comparative example. As shown in FIGS. 18A and 18B, it is possible to obtain intermediate characteristics between the characteristics of the output voltage VDDR in FIG. 6 of the comparative example and the characteristics of the output voltage VDDR in FIG. 8 of the comparative example. In other words, the output voltage VDDR can be brought close to the ideal output voltage VDDR.

Referring to FIGS. 5 and 7, the following will describe the reason why the characteristics of FIGS. 18A and 18B can be obtained.

For example, as shown in FIG. 5, it is assumed that the active voltage dividing circuit 1 is kept at the ground potential VSS in a standby state, the active voltage detecting circuit 3 outputs a detection result before the monitor voltage VMONA reaches the original level higher than the reference voltage VREF, and the boosting operation is performed by the pump circuit 6.

After the boosting operation, when the RACTIVE signal is set at "Low" by auto power down and the switch circuit 2 is turned off into a standby state, the active voltage dividing circuit 1 is charged to the power supply potential VDD as shown in FIG. 17B. When the switch circuit 2 is turned on in this state, as shown in FIG. 7, a pumping signal not enabling the operation of the pump circuit 6 is outputted regardless of the final potential of the monitor voltage VMONA. Thus even when the switch circuit 2 is repeatedly turned on/off in a short period, it is possible to suppress an increase in the output voltage VDDR.

For example, as shown in FIG. 7, it is assumed that the active voltage dividing circuit 1 is kept at the power supply potential VDD in a standby state, the active voltage detecting circuit 3 outputs a detection result before the monitor voltage VMONA reaches the original level lower than the reference potential VREF, and the pump circuit 6 is not operated, so that the boosting operation of the pump circuit 6 is not performed.

After that, when the RACTIVE signal is set at "Low" by auto power down and the switch circuit 2 is turned off into a standby state, the active voltage dividing circuit 1 is charged to the ground potential VSS as shown in FIG. 17B. When the switch circuit 2 is turned on in this state, as shown in FIG. 5, the pumping signal for operating the pump circuit 6 is outputted regardless of the final potential of the monitor voltage VMONA. Thus even when the switch circuit 2 is repeatedly turned on/off in a short period, it is possible to suppress a reduction in the output voltage VDDR.

In the example of FIG. 17B, the ratio of the first voltage applied to the other end of the active voltage dividing circuit 1 in a standby state and the ratio of the second voltage applied to the other end of the active voltage dividing circuit 1 in a standby state are equal to each other. The ratios may be different when necessary.

Thus the output voltage VDDR can be brought more closely to the ideal output voltage VDDR. As described above, the voltage generating circuit of the present embodiment can output a desired voltage with higher accuracy.

Fourth Embodiment

As described in the comparative example, the voltage dividing resistors of the active voltage dividing circuit 1 have parasitic resistances. The present embodiment will describe an example of the configuration of a voltage generating circuit for detecting a voltage with higher accuracy by controlling the potential of an active voltage dividing circuit 1 by means of the parasitic resistances of voltage dividing resistors.

Figure 19:
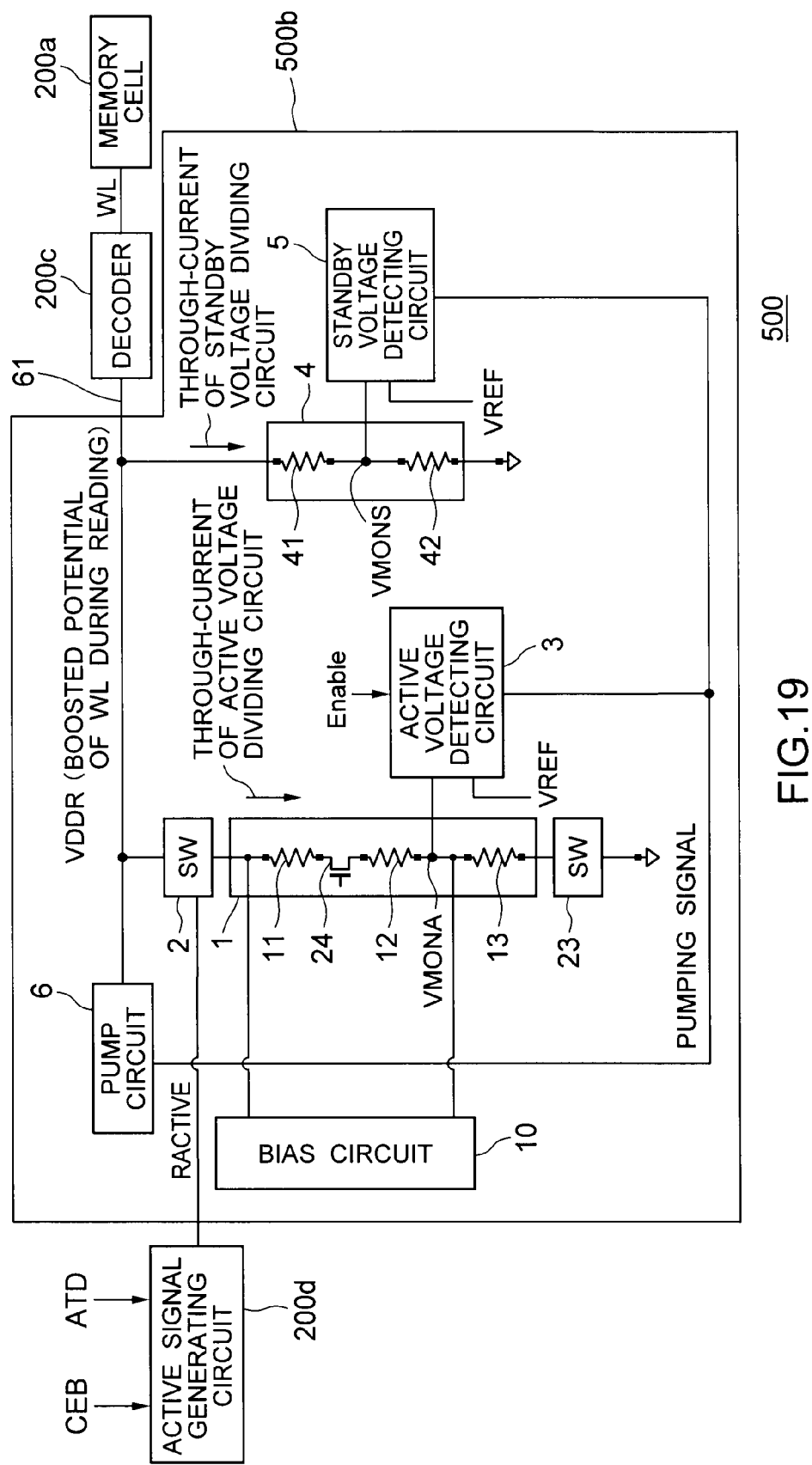
FIG. 19 shows an example of the configuration of a semiconductor memory 500 including the voltage generating circuit according to a fourth embodiment which is an aspect of the present invention.

FIG. 19 shows an example of the configuration of a semiconductor memory 500 including the voltage generating circuit according to a fourth embodiment which is an aspect of the present invention. Configurations indicated by the same reference numerals as the first embodiment are similar to the configurations of the first embodiment.

As shown in FIG. 19, a voltage generating circuit 500b includes the active voltage dividing circuit 1, a switch circuit 2, an active voltage detecting circuit 3, a standby voltage dividing circuit 4, a standby voltage detecting circuit 5, a pump circuit 6, a bias circuit 10, and a switch circuit 23.

The switch circuit 23 is connected between the other end of a voltage dividing resistor 13 and the ground. The switch circuit 23 is controlled so as to be turned on in an active state and turned off in a standby state as the switch circuit 2.

In the present embodiment, the active voltage dividing circuit 1 includes a voltage dividing resistor 11 having one end connected to the switch circuit 2, a switch circuit 24 having one end connected to the other end of the voltage dividing resistor 11, a voltage dividing resistor 12 having one end connected to the other end of the switch circuit 24, and the voltage dividing resistor 13 having one end connected to the other end of the voltage dividing resistor 12. The switch circuit 24 may be independently configured without being included in the active voltage dividing circuit 1.

The switch circuit 24 is controlled so as to be turned on in an active state and turned off in a standby state as the switch circuits 2 and 23.

The bias circuit 10 applies a voltage to the two points of the active voltage dividing circuit 1. In this configuration, for example, the bias circuit 10 has an output connected to the one end of the voltage dividing resistor 11 and the other end of the voltage dividing resistor 12 and applies a desired voltage.

Thus the voltage dividing resistor 12 is connected in series with the voltage dividing resistor 11 between the two points, and the switch circuit 24 is connected between the voltage dividing resistor 11 and the voltage dividing resistor 12. By controlling on/off of the switch circuit 24, the voltage between the voltage dividing resistor 11 and the voltage dividing resistor 12 is interrupted. In other words, the voltage is interrupted between the two points in a standby state.

When switching from a state in which the switch circuits 2, 23 and 24 are turned off (standby state) to a state in which the switch circuits 2, 23 and 24 are turned on (active state), the bias circuit 10 applies a voltage to the active voltage dividing circuit 1 such that a monitor voltage VMONA outputted from the active voltage dividing circuit 1 quickly changes to a voltage around a reference voltage VREF. Thus, for example, the voltage is biased to a voltage V1 across the voltage dividing resistor 11 and to a voltage V2 across the voltage dividing resistors 12 and 13.

As described above, in an active state, the switch circuit 24 is turned on as well as the switch circuits 2 and 23. The bias circuit 10 stops applying the voltage to the active voltage dividing circuit 1 in the active state.

The circuit configuration of the active voltage dividing circuit 1 and the applied voltage are adjusted such that the monitor voltage VMONA quickly changes to a voltage around the reference voltage VREF when the switch circuits 2, 23 and 24 are turned on and the bias circuit 10 is turned off.

For example, the switch circuit 24 is turned off in a standby state, and the bias circuit 10 charges the voltage dividing resistor 11 to a set voltage of an output voltage VDDR (V1=VDDR set value) and sets a ground voltage (V2=ground potential VSS) across the voltage dividing resistors 12 and 13.

In this case, the voltages are set so as to establish the relationship of R1 (the resistance of the voltage dividing resistor 11)=R2 (the resistance of the voltage dividing resistor 12)+R3 (the resistance of the voltage dividing resistor 13). Thus on the source and drain of the switch circuit 24 which is a MOS transistor, a potential is about a half of the set voltage of the output voltage VDDR.

Further, in this setting, the relationship of the output voltage VDDR/2×R3/(R2+R3)=the reference voltage VREF is established. Thus in the case of switching from a standby state to an active state, the monitor voltage VMONA quickly changes to a voltage around a level reflecting the output voltage VDDR. In other words, the active voltage dividing circuit 1 can more quickly output the monitor voltage VMONA which is obtained by correctly dividing the output voltage VDDR.

Thus the voltage generating circuit 500b can output a desired voltage with higher accuracy than in the comparative example.

Figure 20:
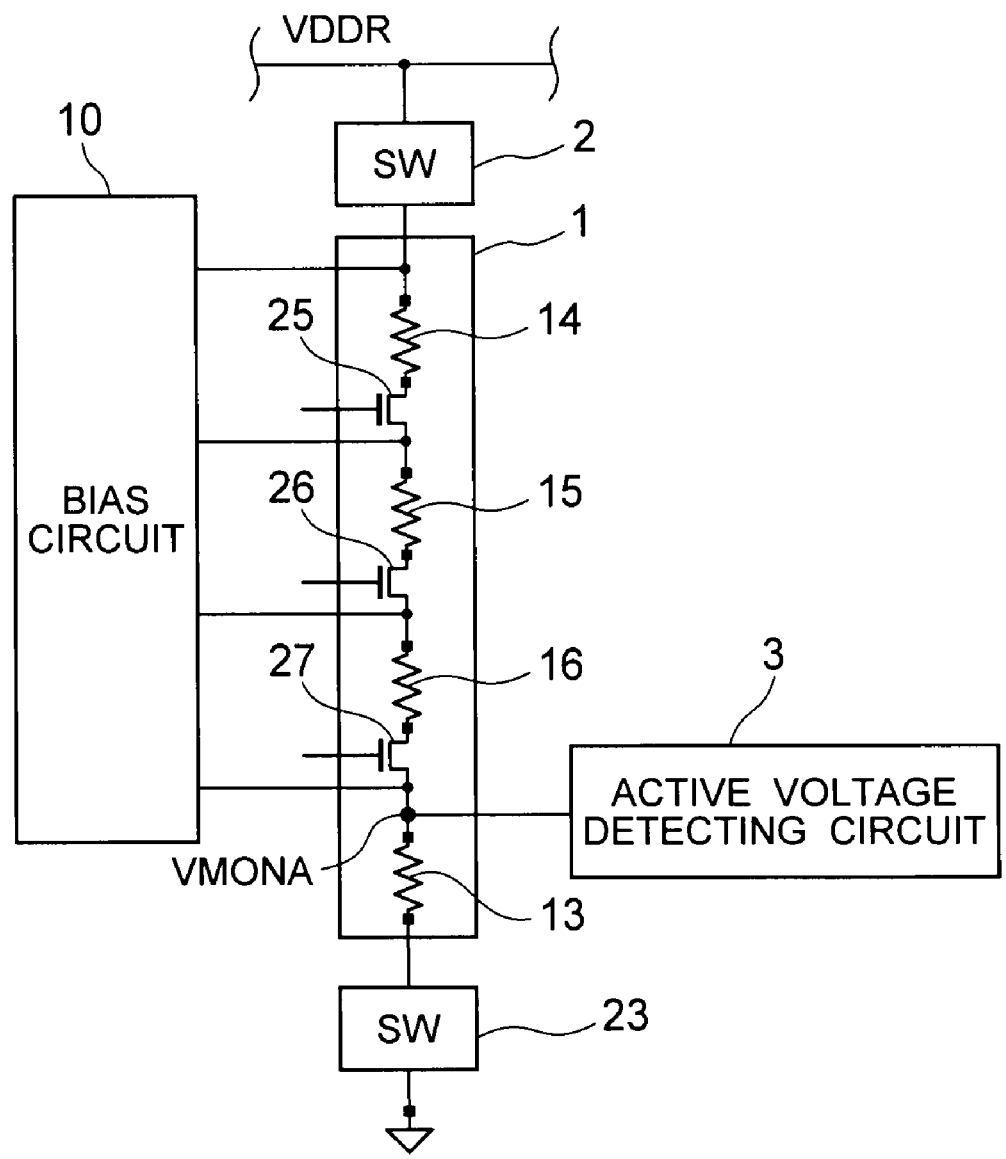
FIG. 20 shows another structural example of the active voltage dividing circuit 1 and the bias circuit 10 in the voltage generating circuit 500b of the present embodiment.

FIG. 20 shows another structural example of the active voltage dividing circuit 1 and the bias circuit 10 in the voltage generating circuit 500b of the present embodiment.

As shown in FIG. 20, the voltage dividing resistors of the active voltage dividing circuit 1 of FIG. 19 are further divided into voltage dividing resistors 14, 15 and 16 with switch circuits 25, 26 and 27. The bias circuit 10 may apply a voltage to the divided voltage dividing resistors 14, 15 and 16.

As described above, the voltage generating circuit of the present embodiment can output a desired voltage with higher accuracy.

Fifth Embodiment

The fourth embodiment described an example of the configuration of the voltage generating circuit for detecting a voltage with higher accuracy by controlling the potential of the active voltage dividing circuit 1 by means of the parasitic resistances of the voltage dividing resistors.

The present embodiment will describe another example of the configuration of the voltage generating circuit for detecting a voltage with higher accuracy by controlling the potential of the active voltage dividing circuit 1 by means of the parasitic resistances of the voltage dividing resistors.

Figure 21:
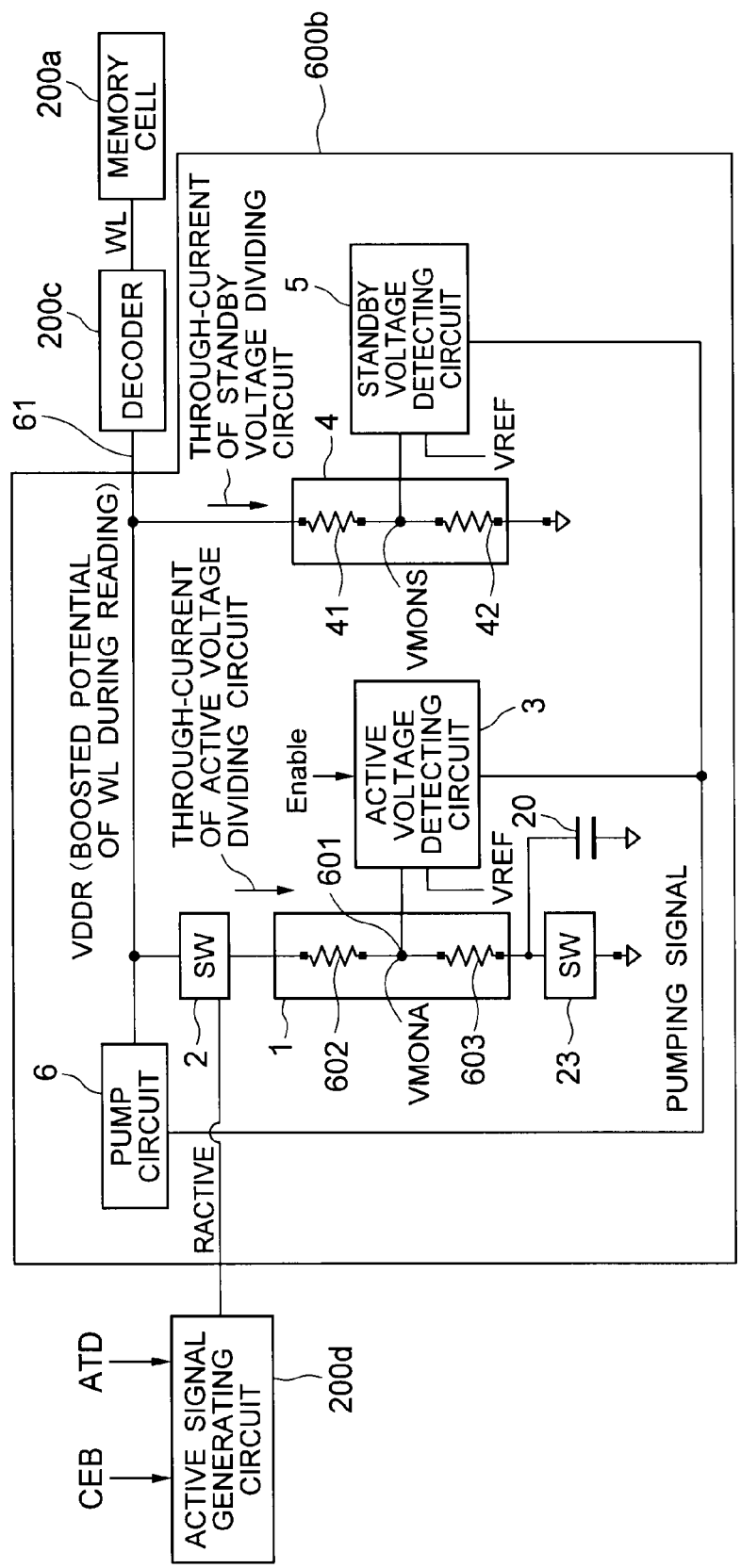
FIG. 21 shows an example of the configuration of a semiconductor memory 600 including a voltage generating circuit according to a fifth embodiment which is an aspect of the present invention.

FIG. 21 shows an example of the configuration of a semiconductor memory 600 including a voltage generating circuit according to a fifth embodiment which is an aspect of the present invention. Configurations indicated by the same reference numerals as the first and fourth embodiments are similar to the configurations of the first embodiment.

As shown in FIG. 21, a voltage generating circuit 600b includes the active voltage dividing circuit 1, a switch circuit 2, an active voltage detecting circuit 3, a standby voltage dividing circuit 4, a standby voltage detecting circuit 5, a pump circuit 6, a capacitive element 20, and a switch circuit 23.

As in the fourth embodiment, the switch circuit 23 is connected between the other end of a voltage dividing resistor 13 and the ground. The switch circuit 23 is controlled so as to be turned on in an active state and turned off in a standby state as the switch circuit 2.

The capacitive element 20 is connected in parallel with the switch circuit 23 between the active voltage dividing circuit 1 and the ground.

For example, the switch circuits 2 and 23 are switched from an active state to a standby state and then are turned off. At this point, the potential of a monitor voltage VMONA is determined by the balance of the parasitic capacitance of a voltage dividing resistor 601 in the active voltage dividing circuit 1, the parasitic resistance of a voltage dividing resistor 602, and a wiring capacitance including the capacitive element 20.

The capacitance value of the capacitive element 20 is set such that the potential of the monitor voltage VMONA in the standby state is set around the potential of a reference voltage VREF.

Thus in a change from a standby state to an active state, the monitor voltage VMONA outputted from the active voltage dividing circuit can be stabilized.

Therefore, the voltage generating circuit 600b can output a desired voltage with higher accuracy than in the comparative example.

As described above, the voltage generating circuit of the present embodiment can output a desired voltage with higher accuracy.

Sixth Embodiment

In the comparative example (FIG. 4), when switching from an active state to a standby state, the on/off of the amplifier circuit 3a1 is controlled as well as the on/off of the through-current of the active voltage dividing circuit 1a. According to a simulation of the applicant, it is confirmed that the reference voltage VREF fluctuates because of the control of the on/off of the amplifier circuit 3a1 and the influence of fluctuations in the monitor voltage VMONA changed by the on/off operation of the through-current passing through the active voltage dividing circuit 1.

As described above, the active voltage detecting circuit 1 compares the monitor voltage VMONA and the reference voltage VREF and outputs the pumping signal based on the comparison result. Thus when the reference voltage VREF fluctuates, the voltage generating circuit cannot detect a voltage with high accuracy.

The present embodiment will describe an example of the configuration of the voltage generating circuit for detecting a voltage with higher accuracy by reducing fluctuations in the reference voltage VREF.

Figure 22:
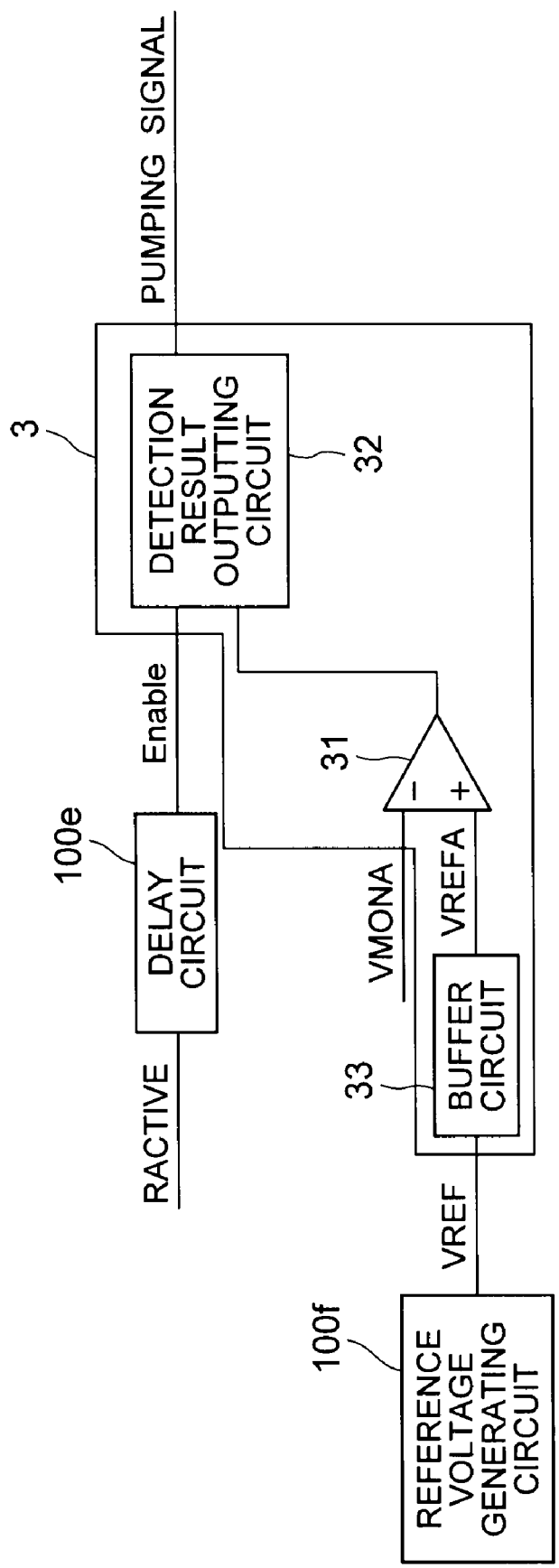
FIG. 22 shows the configuration of an active voltage detecting circuit 3 in a voltage detecting circuit according to a sixth embodiment.

FIG. 22 shows the configuration of an active voltage detecting circuit 3 in a voltage detecting circuit according to a sixth embodiment. Other configurations of the voltage generating circuit are similar to the configurations shown in FIG. 10 of the first embodiment. A delay circuit 100e and a reference voltage generating circuit 100f in FIG. 22 are omitted in FIG. 10 for simplification.

As shown in FIG. 22, the active voltage detecting circuit 3 includes an amplifier circuit 31, a detection result outputting circuit 32, and a buffer circuit 33.

In response to the reference voltage VREF outputted from the reference voltage generating circuit 100f, the buffer circuit 33 outputs a voltage VREFA as high as the reference voltage VREF.

The amplifier circuit 31 compares a monitor voltage VMONA and the voltage VREFA and outputs a signal reflecting the comparison result.

The detection result outputting circuit 32 outputs a signal outputted from the amplifier circuit 31, as a pumping signal in response to an Enable signal inputted from the delay circuit 100e.

Figure 23:
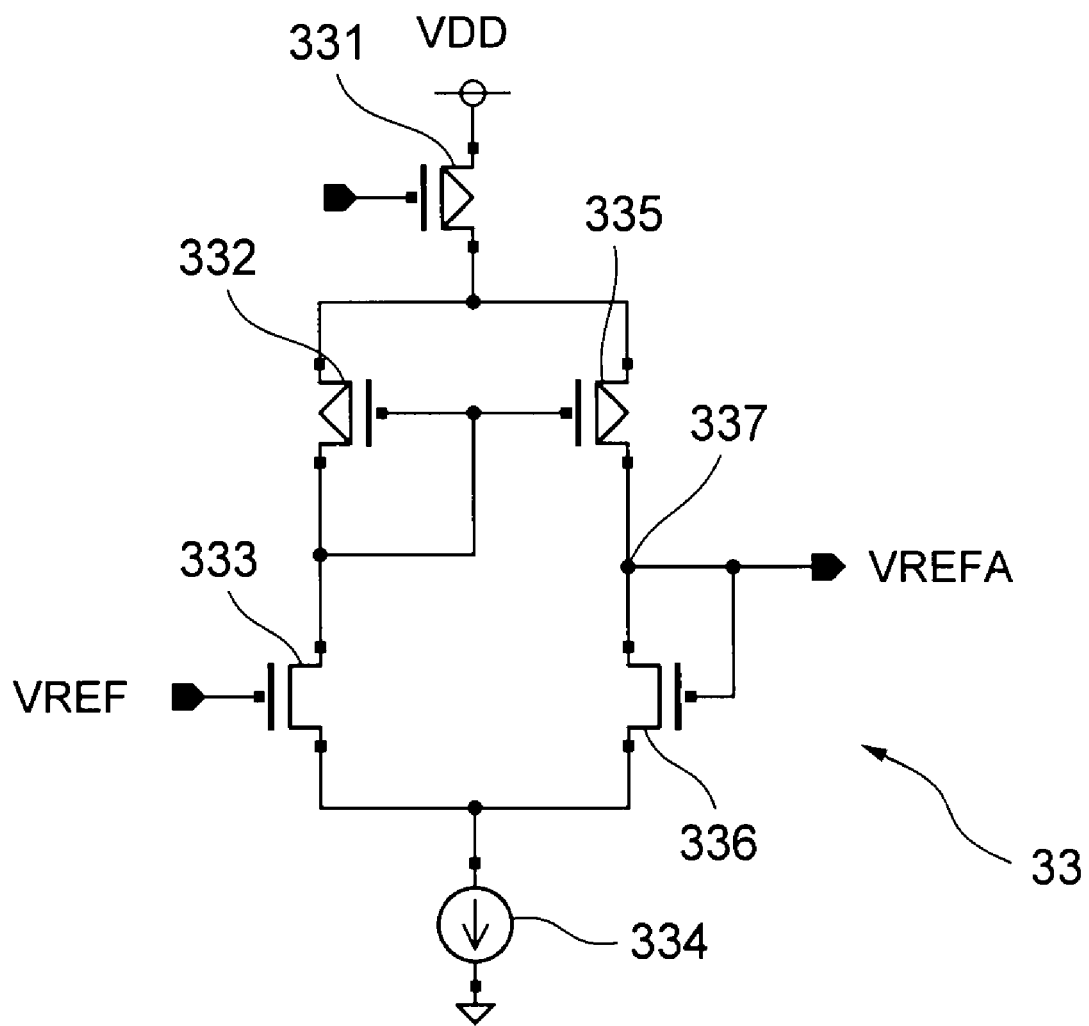
FIG. 23 shows an example of the circuit configuration of the buffer circuit 33 shown in FIG. 22.

The buffer circuit 33 has a circuit configuration which does not transmit the influence of fluctuations in the monitor voltage VMONA and the influence of the on/off operation of the amplifier circuit 31 to the reference voltage generating circuit 100f. FIG. 23 shows an example of the circuit configuration of the buffer circuit 33 shown in FIG. 22.

As shown in FIG. 23, the buffer circuit 33 includes a PMOS transistor 331 having the source connected to a power supply potential VDD, a pMOS transistor 332 which has the source connected to the drain of the PMOS transistor 331 and is diode-connected, an nMOS transistor 333 having the drain connected to the drain of the pMOS transistor 332 and the gate fed with the reference voltage VREF, and a current source 334 connected between the source of the nMOS transistor 333 and the ground.

The buffer circuit 33 includes a PMOS transistor 335 which has the drain connected to the drain of the pMOS transistor 331 and the gate connected to the gate of the pMOS transistor 332 and composes a current mirror circuit with the pMOS transistor 332, and an nMOS transistor 336 having the drain and gate connected to the drain of the pMOS transistor 335 and the source connected to the source of the nMOS transistor 333.

The buffer circuit 33 outputs the voltage VREFA from a terminal 337 between the drain of the pMOS transistor 335 and the source of the nMOS transistor 336 in response to the input of the reference voltage VREF.

Further, the on/off of the buffer circuit 33 is controlled in response to a signal inputted to the pMOS transistor 331.

For example, the buffer circuit 33 having the above circuit configuration can prevent the transmission of the influence to the reference voltage generating circuit 100f. In other words, it is possible to suppress fluctuations in the reference voltage VREF.

Thus the voltage generating circuit of the present embodiment can detect a voltage with higher accuracy. Therefore, the voltage generating circuit of the present embodiment can output a desired voltage with higher accuracy than in the comparative example.

As described above, the voltage generating circuit of the present embodiment can output a desired voltage with higher accuracy.

Seventh Embodiment

In the standby voltage dividing circuit 4a and the active voltage dividing circuit 1a of the comparative example, different currents are passed and the voltage dividing resistors are differently sized. Thus the voltage dividing resistors are dependent on a back bias. As has been described, the voltage dividing resistors vary in back bias and thus the setting is difficult. As the set value of the level of the output voltage VDDR increases, a voltage difference dependent upon a temperature increases. Thus the voltage generating circuit cannot detect a voltage with high accuracy.

The present embodiment will describe an example of the configuration of a voltage generating circuit for detecting a voltage with higher accuracy by reducing a difference in voltage depending upon the above conditions.

Figure 24:
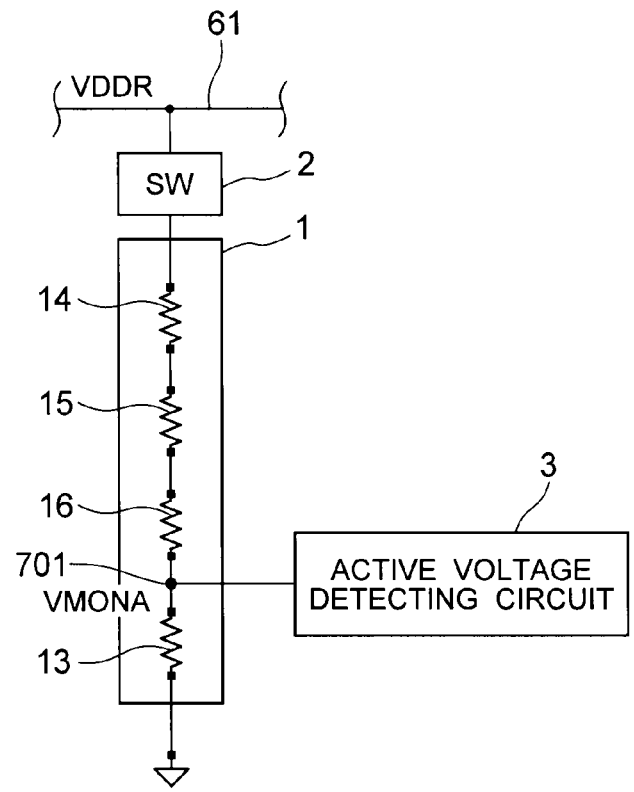
FIG. 24 shows the circuit configuration of an active voltage dividing circuit 1 in a voltage detecting circuit according to a seventh embodiment.
Figure 25:
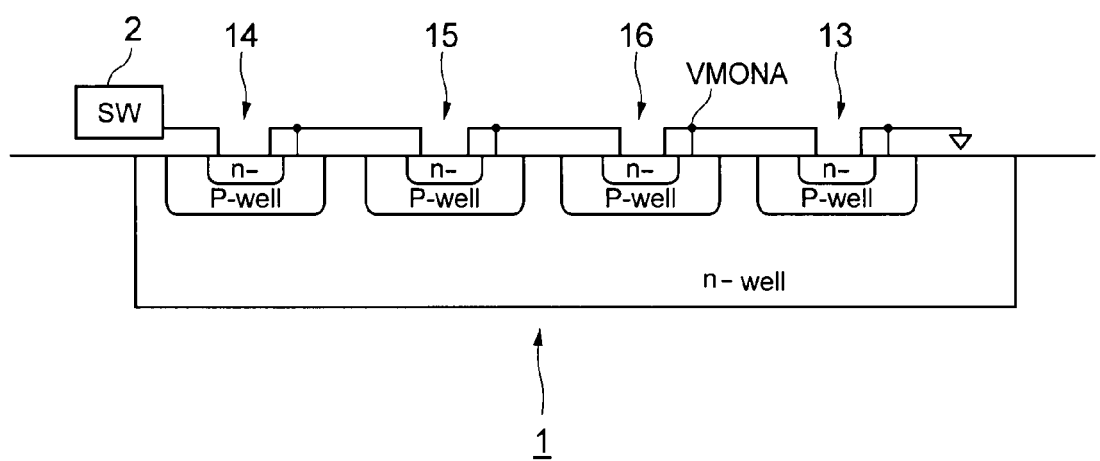
FIG. 25 is a sectional view of the active voltage dividing circuit 1 shown in FIG. 24.

FIG. 24 shows the circuit configuration of an active voltage dividing circuit 1 in a voltage detecting circuit according to a seventh embodiment. FIG. 25 is a sectional view of the active voltage dividing circuit 1 shown in FIG. 24. Other configurations of the voltage generating circuit are similar to the configurations of the first embodiment shown in FIG. 10.

As shown in FIGS. 24 and 25, voltage dividing resistors 13, 14, 15 and 16 are separated by p-wells formed in an n-well.

For example, the voltage dividing resistors 14, 15 and 16 are separated by the p-wells so as to have multiples (one time, a half, a third . . . ) of the resistance of the voltage dividing resistor 13 connected between the ground and a terminal 701 for outputting a monitor voltage. It is therefore possible to obtain a potential several times as large as the potential of a reference voltage VREF according to the conversion of the multiples.

The ground side of an n-region composing each of the voltage dividing resistors is connected to each of the P wells. Thus the bias conditions of the voltage dividing resistors 14, 15 and 16 are the same as those of the voltage dividing resistor 13. In other words, it is possible to reduce a difference in the conditions of the level of an output voltage VDDR. The difference is caused by the application of a back bias.

When the reference voltage VREF does not fluctuate, the difference in the conditions decreases and thus the level of the output voltage VDDR can be more constant.

The same effect can be obtained even when the polarities of the voltage dividing resistors of FIG. 25 are inverted. Further, the present embodiment is similarly applicable to the voltage dividing resistors of a standby voltage dividing circuit. Thus the voltage detecting circuit of the present embodiment can detect a voltage with higher accuracy by reducing a difference in voltage dependent upon the foregoing conditions.

The voltage generating circuit of the present embodiment can therefore output a desired voltage with higher accuracy than in the comparative example.

As described above, the voltage generating circuit of the present embodiment can output a desired voltage with higher accuracy.

What is claimed is:

1. A voltage generating circuit for outputting a voltage from an output terminal, comprising:

a first voltage dividing circuit which is connected between the output terminal and ground, and outputs a first monitor voltage obtained by resistively dividing the voltage outputted from the output terminal;

a switch circuit connected between the output terminal and the first voltage dividing circuit;

a first voltage detecting circuit which compares the first monitor voltage and a reference voltage and outputs a first pumping signal corresponding to a comparison result;

a second voltage dividing circuit which is connected between the output terminal and the ground, outputs a second monitor voltage obtained by resistively dividing the voltage outputted from the output terminal, and has a larger resistance than a resistance of the first voltage dividing circuit;

a second voltage detecting circuit which compares the second monitor voltage and the reference voltage and outputs a second pumping signal corresponding to a comparison result;

a pump circuit which outputs a voltage boosted from a power supply voltage, to the output terminal in response to the first pumping signal or the second pumping signal; and a reset circuit which is connected to an other end of the first voltage dividing circuit, applies one of a first voltage higher than the reference voltage and a second voltage lower than the reference voltage to the other end of the first voltage dividing circuit while the switch circuit is turned off, and applies the second voltage to the other end of the first voltage dividing circuit while the switch circuit is turned on, wherein the voltage applied to the other end of the first voltage dividing circuit while the switch circuit is turned off is switched to one of the first voltage and the second voltage at a time when the switch circuit is switched from the on state to the off state.

2. The voltage generating circuit according to claim 1, wherein with different ratios, the first voltage is applied to an other end of the first voltage dividing circuit while the switch circuit is turned off and the second voltage is applied to the other end of the first voltage dividing circuit while the switch circuit is turned off.

3. The voltage generating circuit according to claim 1, wherein the first voltage is a power supply voltage and the second voltage is a ground voltage.

4. The voltage generating circuit according to claim 2, wherein the first voltage is a power supply voltage and the second voltage is a ground voltage.

5. The voltage generating circuit according to claim 1, wherein the first detecting circuit outputs the first pumping signal for activating the pump circuit when the first monitor voltage is lower than the reference voltage, and outputs the first pumping signal for deactivating the pump circuit when the first monitor voltage is higher than the reference voltage, and the second detecting circuit outputs the second pumping signal for activating the pump circuit when the second monitor voltage is lower than the reference voltage, and outputs the second pumping signal for deactivating the pump circuit when the second monitor voltage is higher than the reference voltage.

6. The voltage generating circuit according to claim 2, wherein the first detecting circuit outputs the first pumping signal for activating the pump circuit when the first monitor voltage is lower than the reference voltage, and outputs the first pumping signal for deactivating the pump circuit when the first monitor voltage is higher than the reference voltage, and the second detecting circuit outputs the second pumping signal for activating the pump circuit when the second monitor voltage is lower than the reference voltage, and outputs the second pumping signal for deactivating the pump circuit when the second monitor voltage is higher than the reference voltage.

7. The voltage generating circuit according to claim 3, wherein the first detecting circuit outputs the first pumping signal for activating the pump circuit when the first monitor voltage is lower than the reference voltage, and outputs the first pumping signal for deactivating the pump circuit when the first monitor voltage is higher than the reference voltage, and the second detecting circuit outputs the second pumping signal for activating the pump circuit when the second monitor voltage is lower than the reference voltage, and outputs the second pumping signal for deactivating the pump circuit when the second monitor voltage is higher than the reference voltage.

8. The voltage generating circuit according to claim 4, wherein the first detecting circuit outputs the first pumping signal for activating the pump circuit when the first monitor voltage is lower than the reference voltage, and outputs the first pumping signal for deactivating the pump circuit when the first monitor voltage is higher than the reference voltage, and the second detecting circuit outputs the second pumping signal for activating the pump circuit when the second monitor voltage is lower than the reference voltage, and outputs the second pumping signal for deactivating the pump circuit when the second monitor voltage is higher than the reference voltage.

* * * * *